United States Patent
Hatakeyama et al.

(10) Patent No.: US 10,854,661 B2
(45) Date of Patent: *Dec. 1, 2020

(54) SOLID-STATE IMAGING DEVICE, INFRARED-ABSORBING COMPOSITION, AND FLATTENED-FILM-FORMING CURABLE COMPOSITION

(71) Applicant: JSR CORPORATION, Tokyo (JP)

(72) Inventors: Kouji Hatakeyama, Tokyo (JP); Tomohiro Takami, Tokyo (JP); Mibuko Shimada, Tokyo (JP)

(73) Assignee: JSR CORPORATION, Tokyo (JP)

( * ) Notice: Subject to any disclaimer, the term of this patent is extended or adjusted under 35 U.S.C. 154(b) by 143 days.

This patent is subject to a terminal disclaimer.

(21) Appl. No.: 15/655,057

(22) Filed: Jul. 20, 2017

(65) Prior Publication Data

US 2017/0317132 A1    Nov. 2, 2017

Related U.S. Application Data

(63) Continuation of application No. PCT/JP2016/051560, filed on Jan. 20, 2016.

(30) Foreign Application Priority Data

Jan. 21, 2015   (JP) .................................. 2015-009475

(51) Int. Cl.
*G02B 5/20* (2006.01)
*H01L 27/146* (2006.01)
(Continued)

(52) U.S. Cl.
CPC ........ *H01L 27/14649* (2013.01); *G02B 5/208* (2013.01); *G02B 5/223* (2013.01);
(Continued)

(58) Field of Classification Search
CPC . G02B 5/00; G02B 5/003; G02B 5/20; G02B 5/205; G02B 5/208; G02B 5/22;
(Continued)

(56) References Cited

U.S. PATENT DOCUMENTS 4,730,902 A   3/1988   Suzuki et al.
4,763,966 A   8/1988   Suzuki et al.
(Continued)

FOREIGN PATENT DOCUMENTS

CN   103839952 A   6/2014
CN   107076894 A   8/2017
(Continued)

OTHER PUBLICATIONS

International Search Report dated Apr. 19, 2016 for the PCT application No. PCT/JP2016/051560, with English translation.
(Continued)

*Primary Examiner* — Thong Q Nguyen
(74) *Attorney, Agent, or Firm* — Michael Best & Friedrich LLP

(57) ABSTRACT

Provided is a solid-state imaging device that includes: a first pixel provided with a color filter layer having a transmission band in a visible light wavelength region on a light-receiving surface of a first light-receiving element; a second pixel provided with an infrared pass filter layer having a transmission band in an infrared wavelength region on a light-receiving surface of a second light-receiving element; an infrared cut filter layer that is provided on a position overlapping with the color filter layer and transmits light in the visible light wavelength region by blocking light in the infrared wavelength region; and a cured film provided in contact with the infrared cut filter layer.

13 Claims, 9 Drawing Sheets

(51) Int. Cl.
  *H01L 27/14* (2006.01)
  *H04N 5/369* (2011.01)
  *G02B 5/22* (2006.01)
  *H01L 27/148* (2006.01)
  *H04N 5/33* (2006.01)

(52) U.S. Cl.
  CPC ........ *H01L 27/14* (2013.01); *H01L 27/14645* (2013.01); *H01L 27/14806* (2013.01); *H04N 5/33* (2013.01); *H04N 5/369* (2013.01)

(58) Field of Classification Search
  CPC .. G02B 5/26; G02B 5/28; G02B 5/281; H01L 27/14; H01L 27/14645; H01L 27/14649; H01L 27/14806; H01L 27/146; H01L 27/14652; H01L 27/14685; H01L 31/0232; H01L 27/14621; H01L 27/14627; H04N 5/33; H04N 5/369; H04N 5/225; H04N 5/2254; H04N 5/332
  See application file for complete search history.

(56) References Cited

U.S. PATENT DOCUMENTS

| | | | |
|---|---|---|---|
| 4,767,571 A | 8/1988 | Suzuki et al. | |
| 4,788,128 A | 11/1988 | Barlow | |
| 4,981,773 A | 1/1991 | Suzuki et al. | |
| 5,359,056 A | 10/1994 | Kaieda et al. | |
| 5,399,604 A | 3/1995 | Sano et al. | |
| 5,405,976 A | 4/1995 | Telfer et al. | |
| 5,453,611 A | 9/1995 | Oozu et al. | |
| 5,604,281 A | 2/1997 | Kamei et al. | |
| 5,702,820 A | 12/1997 | Yokoshima et al. | |
| 5,847,015 A | 12/1998 | Tajima et al. | |
| 5,998,609 A | 12/1999 | Aoki et al. | |
| 6,013,415 A | 1/2000 | Sakurai et al. | |
| 6,069,244 A | 5/2000 | Masuda et al. | |
| 6,120,973 A | 9/2000 | Itano et al. | |
| 6,323,340 B1 | 11/2001 | Masuda et al. | |
| 8,237,121 B2 * | 8/2012 | Morin | H01L 27/14625 250/338.4 |
| 9,917,134 B1 | 3/2018 | Hsieh et al. | |
| 2003/0118937 A1 | 6/2003 | Nara et al. | |
| 2003/0156080 A1 | 8/2003 | Koike et al. | |
| 2003/0234995 A1 | 12/2003 | Masuda et al. | |
| 2004/0137367 A1 | 7/2004 | Kitayama et al. | |
| 2005/0148786 A1 | 7/2005 | Ikeda et al. | |
| 2006/0000388 A1 | 1/2006 | Campbell et al. | |
| 2006/0073407 A1 | 4/2006 | Yamanobe et al. | |
| 2006/0145220 A1 * | 7/2006 | Hwang | H01L 27/14621 257/294 |
| 2009/0269683 A1 | 10/2009 | Kawamoto et al. | |
| 2010/0230811 A1 * | 9/2010 | Shin | H01L 24/05 250/208.1 |
| 2011/0001205 A1 * | 1/2011 | Sul | H01L 27/14621 257/432 |
| 2012/0056073 A1 * | 3/2012 | Ahn | H01L 27/14609 250/208.1 |
| 2012/0181506 A1 * | 7/2012 | Farmer | H01L 29/1606 257/29 |
| 2012/0187281 A1 * | 7/2012 | Kerness | H01L 27/14618 250/214.1 |
| 2014/0138519 A1 * | 5/2014 | Wang | G01S 17/89 250/206.1 |
| 2015/0287756 A1 | 10/2015 | Ezoe et al. | |
| 2015/0311239 A1 * | 10/2015 | Won | H01L 27/14621 257/432 |
| 2016/0099280 A1 * | 4/2016 | Huang | H01L 27/14621 250/208.1 |
| 2016/0163760 A1 | 6/2016 | Tsai et al. | |
| 2017/0345860 A1 * | 11/2017 | Nagaya | G02B 5/22 |

FOREIGN PATENT DOCUMENTS

| | | |
|---|---|---|
| JP | S60-224589 A | 11/1985 |
| JP | S60-228448 A | 11/1985 |
| JP | S61-032003 A | 2/1986 |
| JP | S61-042585 A | 3/1986 |
| JP | S61-080106 A | 4/1986 |
| JP | S62-039682 A | 2/1987 |
| JP | S64-074272 A | 3/1989 |
| JP | H01-113482 A | 5/1989 |
| JP | H01-114801 A | 5/1989 |
| JP | H01-146846 A | 6/1989 |
| JP | H01-228960 A | 9/1989 |
| JP | H04-023868 A | 1/1992 |
| JP | H04-039361 A | 2/1992 |
| JP | H05-019467 A | 1/1993 |
| JP | H05-078364 A | 3/1993 |
| JP | H05-222047 A | 8/1993 |
| JP | H05-222301 A | 8/1993 |
| JP | H05-222302 A | 8/1993 |
| JP | H05-345861 A | 12/1993 |
| JP | H06-025548 A | 2/1994 |
| JP | H06-107663 A | 4/1994 |
| JP | H06-157716 A | 6/1994 |
| JP | H06-192389 A | 7/1994 |
| JP | H06-192584 A | 7/1994 |
| JP | H06-204444 A | 7/1994 |
| JP | H06-217079 A | 8/1994 |
| JP | H06-228533 A | 8/1994 |
| JP | H06-230212 A | 8/1994 |
| JP | H07-118551 A | 5/1995 |
| JP | H07-118552 A | 5/1995 |
| JP | H07-140654 A | 6/1995 |
| JP | H07-207211 A | 8/1995 |
| JP | H08-027371 A | 1/1996 |
| JP | H08-120186 A | 5/1996 |
| JP | H08-225751 A | 9/1996 |
| JP | H08-259876 A | 10/1996 |
| JP | H09-100338 A | 4/1997 |
| JP | H09-202860 A | 8/1997 |
| JP | H09-325494 A | 12/1997 |
| JP | H10-031308 A | 2/1998 |
| JP | H10-120927 A | 5/1998 |
| JP | H10-180922 A | 7/1998 |
| JP | H10-182995 A | 7/1998 |
| JP | H10-300922 A | 11/1998 |
| JP | H11-035838 A | 2/1999 |
| JP | H11-044955 A | 2/1999 |
| JP | H11-140144 A | 5/1999 |
| JP | H11-152413 A | 6/1999 |
| JP | H11-152414 A | 6/1999 |
| JP | H11-152415 A | 6/1999 |
| JP | H11-174224 A | 7/1999 |
| JP | H11-258415 A | 9/1999 |
| JP | 2000-026748 A | 1/2000 |
| JP | 2000-056118 A | 2/2000 |
| JP | 2000-063691 A | 2/2000 |
| JP | 3094037 B2 | 10/2000 |
| JP | 2000-344866 A | 12/2000 |
| JP | 2001-106689 A | 4/2001 |
| JP | 2003-222717 A | 8/2003 |
| JP | 2004-018561 A | 1/2004 |
| JP | 2004-101728 A | 4/2004 |
| JP | 2005-220060 A | 8/2005 |
| JP | 2005-537319 A | 12/2005 |
| JP | 2006-259680 A | 9/2006 |
| JP | 2006-282480 A | 10/2006 |
| JP | 3834479 B2 | 10/2006 |
| JP | 2007-031644 A | 2/2007 |
| JP | 2007-039343 A | 2/2007 |
| JP | 2007-080926 A | 3/2007 |
| JP | 2007-169315 A | 7/2007 |
| JP | 2007-169343 A | 7/2007 |
| JP | 2007-246464 A | 9/2007 |
| JP | 2007-271745 A | 10/2007 |
| JP | 2007-334325 A | 12/2007 |
| JP | 2008-005213 A | 1/2008 |
| JP | 2008-009206 A | 1/2008 |
| JP | 2008-156393 A | 7/2008 |

(56) References Cited

FOREIGN PATENT DOCUMENTS

| | | |
|---|---|---|
| JP | 2008-181095 A | 8/2008 |
| JP | 2008-241744 A | 10/2008 |
| JP | 2008-242078 A | 10/2008 |
| JP | 2009-108267 A | 5/2009 |
| JP | 2009-185161 A | 8/2009 |
| JP | 2009-191213 A | 8/2009 |
| JP | 2009-215542 A | 9/2009 |
| JP | 2010-053330 A | 3/2010 |
| JP | 2010-055066 A | 3/2010 |
| JP | 2011-038007 A | 2/2011 |
| JP | 2011-068731 A | 4/2011 |
| JP | 2012-068418 A | 4/2012 |
| JP | 2012-118279 A | 6/2012 |
| JP | 4965083 B2 | 7/2012 |
| JP | 2012-189632 A | 10/2012 |
| JP | 2012-209913 A | 10/2012 |
| JP | 2012-215806 A | 11/2012 |
| JP | 2013-083932 A | 5/2013 |
| JP | 5213944 B2 | 6/2013 |
| JP | 2013-137337 A | 7/2013 |
| JP | 2013-151675 A | 8/2013 |
| JP | 2013-155353 A | 8/2013 |
| JP | 2013-195480 A | 9/2013 |
| JP | 2013-253224 A | 12/2013 |
| JP | 2014-026070 A | 2/2014 |
| JP | 2014-026178 A | 2/2014 |
| JP | 2014-032380 A | 2/2014 |
| JP | 2014-098140 A | 5/2014 |
| JP | 2014-103657 A | 6/2014 |
| JP | 2014-115438 A | 6/2014 |
| JP | 2014-130332 A | 7/2014 |
| JP | 2014-130343 A | 7/2014 |
| JP | 2014-139616 A | 7/2014 |
| JP | 2014-139617 A | 7/2014 |
| JP | 5552364 B2 | 7/2014 |
| JP | 2014-142582 A | 8/2014 |
| JP | 2014-152194 A | 8/2014 |
| JP | 2014-174406 A | 9/2014 |
| JP | 2014-189746 A | 10/2014 |
| JP | 2014-197170 A | 10/2014 |
| JP | 2014-199925 A | 10/2014 |
| JP | 2014-207493 A | 10/2014 |
| JP | 5626063 B2 | 11/2014 |
| KR | 10-2010-0018851 A | 2/2010 |
| KR | 10-2014-0072407 A | 6/2014 |
| TW | I225164 B | 12/2004 |
| TW | 2014-026190 A | 7/2014 |
| TW | 2014-043562 A | 11/2014 |
| TW | I577731 B | 4/2017 |
| WO | 02/16144 A1 | 2/2002 |
| WO | 03/005076 A1 | 1/2003 |
| WO | 2004/048480 A1 | 6/2004 |
| WO | 2005/044782 A1 | 5/2005 |
| WO | 2006/120888 A1 | 11/2006 |
| WO | 2007/029871 A1 | 3/2007 |
| WO | 2007/148595 A1 | 12/2007 |
| WO | 2011/118171 A1 | 9/2011 |
| WO | 2015/005448 A1 | 1/2015 |

OTHER PUBLICATIONS

Written Opinion of the International Search Authority dated Apr. 19, 2016 for the PCT application No. PCT/JP2016/051560, with English translation.
Written Opinion of the International Search Authority dated Apr. 19, 2016 for the PCT application No. PCT/JP2016/051560, with English translation which was filed Oct. 20, 2017.
Japanese Office Action dated Aug. 6, 2019 for the corresponding Japanese Patent Application No. 2016-570677, With English translation retrieved from the JPO One Portal Dossier.
Japanese Office Action dated Dec. 17, 2019 for the corresponding Japanese application No. 2016-570677, with English translation retrieved from the JPO One Portal Dossier.
U.S. Office Action dated Feb. 11, 2020, for the co-pending U.S. Appl. No. 15/654,881.
Japanese Office Action dated Mar. 10, 2020, for the co-pending Japanese Patent Application No. 2016-570678, with partial English translation retrieved from the JPO One Portal Dossier.
Japanese Office Action dated Jun. 16, 2020 for the corresponding Japanese application No. 2016-570677, with English translation retrieved from the JPO One Portal Dossier.
Chinese Office Action dated Mar. 12, 2020 for the corresponding Chinese application No. 201680004533.4, with English translation retrieved from the EPO Global Dossier service.
Taiwanese Office Action dated Dec. 22, 2018 for the corresponding Taiwanese application No. 104141403, with partial English translation.
Chinese Office Action dated Aug. 4, 2020 for the corresponding Chinese application No. 201680004533.4, with English translation retrieved from the EPO Global Dossier service.
Japanese Decision of Refusal dated Sep. 29, 2020 for the co-pending Japanese Application No. 2016-570678, with English translation retrieved from the JPO One Portal Dossier.
Japanese Decision of Dismissal of Amendment dated Sep. 29, 2020 for the co-pending Japanese Application. No. 2016-570678, with English translation retrieved from the JPO One Portal Dossier.

* cited by examiner

SOLID-STATE IMAGING DEVICE, INFRARED-ABSORBING COMPOSITION, AND FLATTENED-FILM-FORMING CURABLE COMPOSITION

CROSS-REFERENCE TO RELATED APPLICATIONS

This application is based upon and claims the benefit of priority from the prior Japanese Patent Application No. 2015-009475, filed on Jan. 21, 2015 and PCT International Patent Application No. PCT/JP2016/051560, filed on Jan. 20, 2016, the entire contents of which are incorporated herein by reference.

FIELD

The present invention relates to a solid-state imaging device, an infrared-absorbing composition and a flattened-film-forming curable composition, which may be used in the solid-state imaging device.

BACKGROUND

A solid-state imaging device used in an imaging device such as a camera or the like includes light-receiving elements (visible-light detection sensor) that detect visible light for every pixel, generate an electric signal corresponding to visible light incident from the outside, and process the electric signal to form a captured image. As a configuration of a light-receiving part of the solid-state imaging device, a CMOS image sensor or a CCD image sensor, which is formed with a semiconductor substrate, is known.

The solid-state imaging device blocks light other than visible light, which becomes a noise component, in order to accurately detects intensity of the visible light incident on the light-receiving element. For example, there is a technology in which before the incident light reaches the light-receiving element, an infrared component is blocked with an infrared cut filter. In this case, since substantially only light in visible light region reaches the light-receiving element, a sensing operation relatively low in the noise component may be realized.

On the other hand, there is an increasing need of imparting a sensing function such as motion capture or a distance cognition (space cognition), which uses a near-infrared light, to the solid-state imaging device. In order to realize this, it has been tried to incorporate a distance image sensor that adopts a TOF (Time of Flight) method in the solid-state imaging device.

The TOF method is a technology that measures a distance from a light source to an object to be imaged by measuring a time until irradiation light output from the light source is reflected by the object to be imaged and the reflected light is detected by the light-receiving part. For ranging, a phase difference of light is used. That is, since a phase difference is generated in the reflected light depending on the distance to the object to be imaged, in the TOF method, this phase difference is converted into a time difference, and based on the time difference and a speed of light, the distance up to the object to be imaged is measured for every pixel.

Since the solid-state imaging device that adopts the TOF method like this is necessary to detect the intensity of the visible light and the intensity of the near-infrared light for every pixel, it is necessary to provide a light-receiving element for detecting visible light and a light-receiving element for detecting near-infrared light for every pixel. For example, as an example where the light-receiving element for detecting visible light and the light-receiving element for detecting near-infrared light are provided for every pixel, a technology described in Japanese Patent Application Laid-open No. 2014-103657 is known.

In the Japanese Patent Application Laid-open No. 2014-103657, a solid-state imaging device in which an optical filter array containing a dual band pass filter and an infrared pass filter and a pixel array containing a RGB pixel array and a TOF pixel array are combined is disclosed. According to the technology described in the Japanese Patent Application Laid-open No. 2014-103657, the dual band pass filter allows selective transmission of the visible light and the infrared light, and the infrared pass filter provided only on the TOF pixel array allows transmission of the infrared light. Thus, since the visible light and the infrared light are incident on the RGB pixel array and the infrared light is incident on the TOF pixel array, each pixel array may detect necessary light ray.

In the solid-state imaging device that adopts the TOF method, since a pixel array for detecting infrared light is added to the RGB pixel array for detecting the visible light, performance of the infrared cut filter and production easiness become important. As an example of the infrared cut filter, in Japanese Patent Application Laid-open No. 2013-137337, a technology in which a metal oxide and a diimmonium dye are used as an infrared-absorbing agent and an infrared-absorbing liquid composition is spin-coated is disclosed. Further, in Japanese Patent Application Laid-open No. 2013-151675, an infrared cut filter containing a metal oxide and a dye as an infrared-absorbing composition is disclosed. Still further, in Japanese Patent Application Laid-open No. 2014-130343, a curable resin composition that contains a dye having a maximum absorption wavelength in the range of wavelength of 600 to 850 nm and may be formed by a coating method is disclosed.

In the similar manner as that an imaging function is added to a portable information device such as a smart phone or a tablet terminal, the solid-state imaging device is used in many electronic devices. As the usage expands, a thinner solid-state imaging device is demanded.

However, in the solid-state imaging device disclosed in Japanese Patent Application Laid-open No. 2014-103657, on a top surface of the RGB pixel array and the TOF pixel array, a micro-lens array is provided, separately, the dual band pass filter, the visible pass filter and the infrared pass filter are added. That is, since in addition to the pixel array, the optical filter is provided as a separate component, thinning of the solid-state imaging device is not attained.

In order to attain down-sizing of a solid-state imaging device, it is considered to directly stack an optical filter on a top surface of the pixel array. In this case, it is necessary to stack a layer that forms a specific optical filter directly on a layer that forms another optical filter or with another intermediate layer interposed therebetween. Further, in order to make the solid-state imaging device thinner, the optical filter is necessary to be thinned. However, the compositions and the optical filter layers for forming the optical filters, which are disclosed in Japanese Patent Application Laid-open No. 2013-137337, Japanese Patent Application Laid-open No. 2013-151675, and Japanese Patent Application Laid-open No. 2014-130343, consider nothing about adhesiveness of stacking interfaces or thinning.

SUMMARY

According to one embodiment of the present invention, a solid-state imaging device that includes first pixels provided with a color filter layer having a transmission band in a visible light wavelength region on a light-receiving surface of a first light-receiving element, second pixels provided with an infrared pass filter layer having a transmission band in an infrared wavelength region on a light-receiving surface of a second light-receiving element, an infrared cut filter layer that is provided on a position overlapping with the color filter layer and transmits light in the visible light wavelength region by blocking light in an infrared wavelength region, and a cured film provided in contact with the infrared cut filter layer is provided.

According to another embodiment of the present invention, a solid-state imaging device that includes first pixels provided with a color filter layer having a transmission band in a visible light wavelength region on a light-receiving surface of a first light-receiving element, second pixels provided with an infrared pass filter layer having a transmission band in an infrared wavelength region on a light-receiving surface of a second light-receiving element, an infrared cut filter layer that is provided in contact with a lower surface of the color filter layer and blocks light in an infrared wavelength region and transmits light in the visible light wavelength region, and an organic film provided in contact with a lower surface of the infrared cut filter layer is provided.

DESCRIPTION OF EMBODIMENTS

Figure 1:
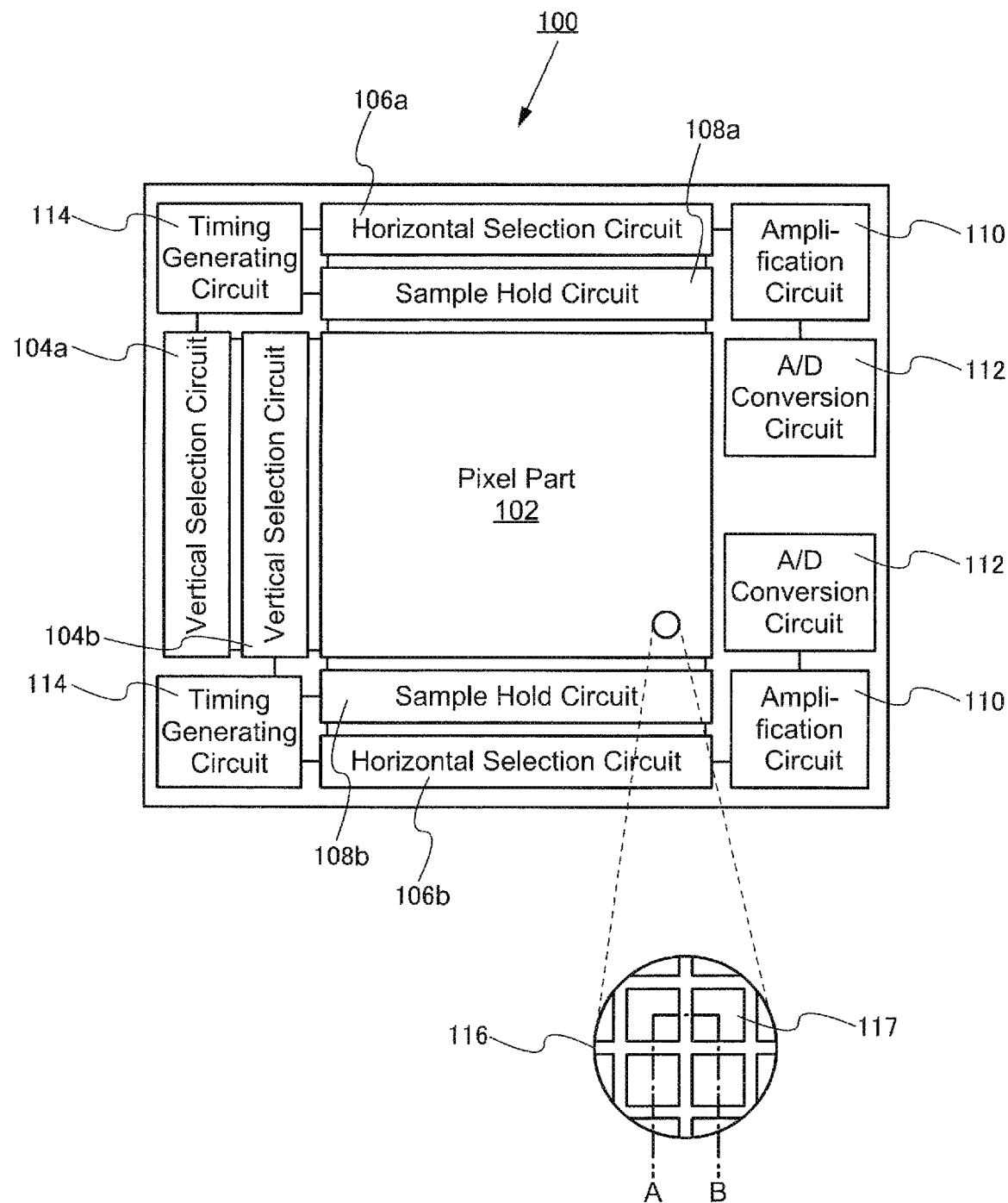
FIG. 1 is a schematic configuration diagram showing one example of a solid-state imaging device according to one embodiment of the present invention.

In what follows, embodiments of the present invention will be described with reference to drawings and so on. However, the present invention may be performed in many different aspects of the present invention, and should not be construed by limiting to description contents of embodiments illustrated below. In order to more clarify the explanation, in the drawings, a width, a thickness, a shape and the like of the respective parts may be schematically represented in comparison with an actual aspect. However, it is consistently one example and does not limit interpretation of the present invention. Further, in the present specification and the respective drawings, the same elements as those described with reference to described drawings may be appropriately omitted from detailed description by giving the same reference sign.

In the present specification, when a certain member or a region is present "above (or below)" other member or region, unless particular restriction, this includes not only a case of being immediately above (or immediately below) other member or region, but also a case of being above (or below) other member or region, that is, a case where above (or below) another member or region a separate constituent element is present is also included.

First Embodiment 1-1. Structure of Solid-State Imaging Device

FIG. 1 is a schematic configuration diagram showing one example of a solid-state imaging device 100 according to present embodiment. As shown in FIG. 1, the solid-state imaging device 100 includes a pixel part 102, vertical selection circuits 104a and 104b, horizontal selection circuits 106a and 106b, sample hold circuits 108a and 108b, an amplification circuit 110, an A/D conversion circuit 112, a timing generating circuit 114 and so on. The pixel part 102 and various functional circuits provided accompanying the pixel part 102 may be provided on the same substrate (semiconductor chip). The pixel part 102 may have a structure of a CMOS type image sensor or a CCD type image sensor.

The pixel part 102 includes a plurality of pixels arranged in a row direction and in a column direction, for example, address lines are arranged in the row direction, and signal lines are arranged in the column direction. Each of the vertical selection circuits 104a and 104b gives a signal to the address line, sequentially selects the pixels row by row, and a detection signal is output from each pixel of the selected row to the signal line to read out from the sample hold circuits 108a and 108b. Each of the horizontal selection circuits 106a and 106b takes out sequentially the detection signals held by the sample hold circuits 108a and 108b and outputs to the amplification circuit 110. The amplification circuit 110 amplifies the detection signal at an appropriate gain, and outputs to the A/D conversion circuit 112. The A/D conversion circuit 112 converts the detection signal that is an analog signal into a digital signal and outputs. The timing generating circuit 114 controls operation timings of the vertical selection circuit 104, the horizontal selection circuits 106a and 106b and the sample hold circuits 108a and 108b.

In FIG. 1, a configuration in which a horizontal selection circuit 106a and a sample hold circuit 108a on an upper side relative to the pixel part 102 synchronize with a vertical selection circuit 104a, and a horizontal selection circuit 106b and a sample hold circuit 108b on a lower side synchronize with a vertical selection circuit 104b is shown. However, this is only an illustration, and the solid-state imaging device according to the present invention may have a configuration driven by a pair of vertical selection circuits, a horizontal selection circuit and a sample hold circuit. Further, a circuit configuration that drives the pixel part 102 may have another configuration.

Figure 2:
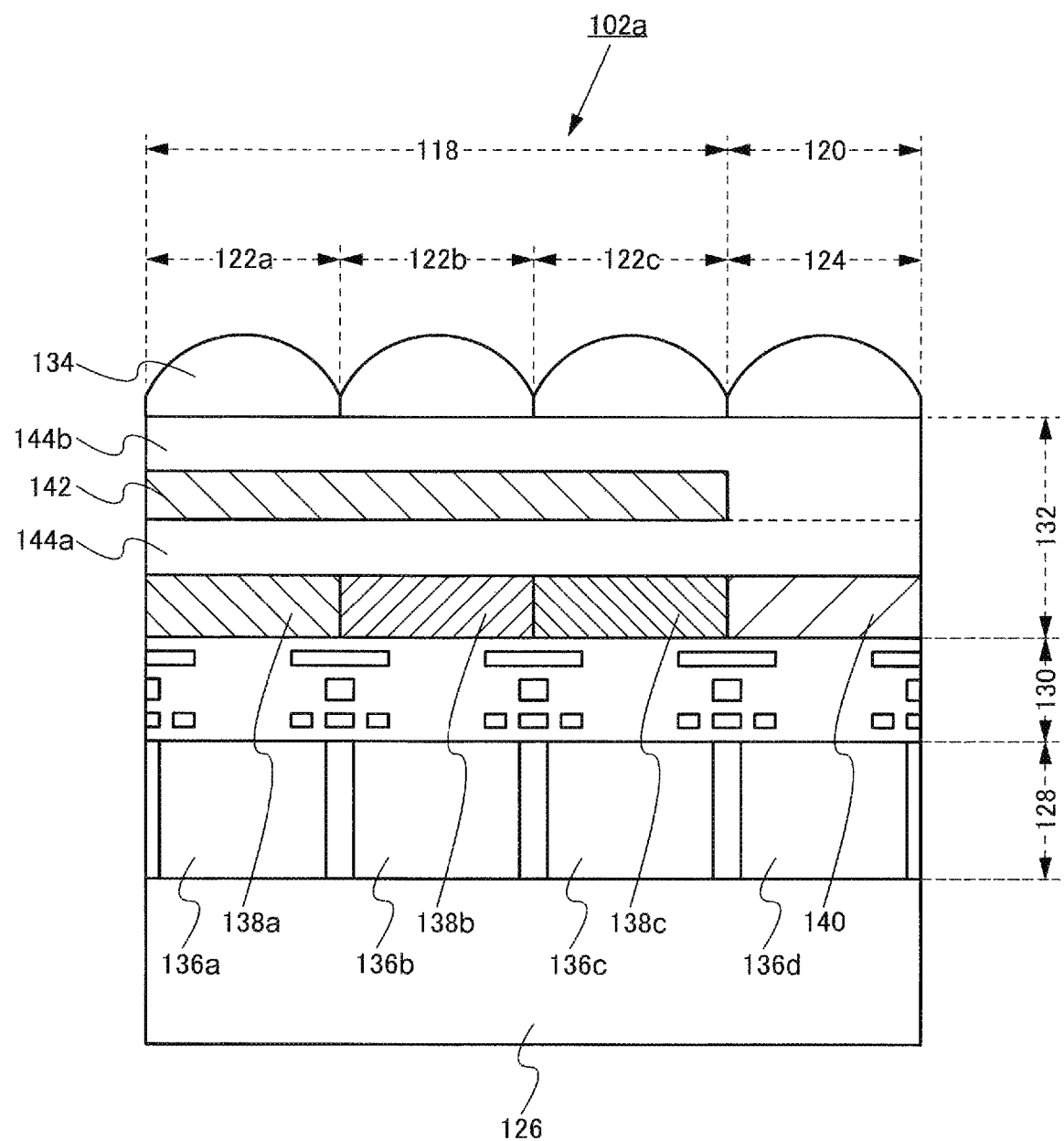
FIG. 2 is a cross-sectional diagram showing a configuration of a pixel part of the solid-state imaging device according to one embodiment of the present invention.

An enlargement part 116 shown in FIG. 1 shows a part of the pixel part 102 by enlarging. In the pixel part 102, as was described above, pixels 117 are arranged in the row direction and the column direction. In FIG. 2, a cross-section structure along an A-B line of the pixel part 102a shown in the enlargement part 116 is shown.

FIG. 2 shows that the pixel part 102a includes a visible light detection pixel 118 and an infrared light detection pixel 120. The visible light detection pixel 118 includes first pixels 122a to 122c, and the infrared light detection pixel 120 includes a second pixel 124. The pixel part 102a has a structure in which a semiconductor layer 128, a wiring layer 130, an optical filter layer 132, and a micro-lens array 134 are stacked from a substrate 126 side.

As the substrate 126, a semiconductor substrate is used. As the semiconductor substrate, for example, a silicon substrate, a substrate provides with a silicon layer on an insulating layer (SOI substrate) or the like is used. The semiconductor layer 128 is provided on a semiconductor region of such substrate 126. For example, in the case where the substrate 126 is a silicon substrate, the semiconductor layer 128 is contained in an upper layer part of the silicon substrate. In the semiconductor layer 128, photodiodes 136a to 136d are provided corresponding to the respective pixels.

In the present specification, the photodiodes 136a to 136c are called also a "first light-receiving element" and the photodiode 136d is called also a "second light-receiving element". Now, the first light-receiving element and the second light-receiving element are not limited to the photodiode, and, as far as it is an element having a function of generating a current or a voltage due to a photovoltaic force effect, other element may be used as a substituent. Further, in the semiconductor layer 128, a circuit for acquiring a detection signal from each of the photodiodes 136a to 136d is formed with an active element such as a transistor or the like.

The wiring layer 130 is a layer including a wiring provided on the pixel part 102a such as the address line and signal line. The wiring layer 130 may be formed into a multilayer by separating a plurality of wirings by an interlayer insulating film. In the usual case, since the address lines and the signal lines intersect by extending in the row direction and the column direction, the address lines and the signal lines are provided on different layers with the interlayer insulating film sandwiched therebetween.

The optical filter layer 132 is formed by including a plurality of layers having different optical characteristics. In the present embodiment, on the wiring layer 130, color filter layers 138a to 138c having transmission bands of the visible light wavelength region are provided overlapped on the photodiodes 136a to 136c, and an infrared pass filter 140 is provided overlapped on the photodiode 136d.

On a top surface of a region where the color filter layers 138a to 138c that transmit light in a visible light wavelength region are provided, an infrared cut filter layer 142 that blocks light in infrared wavelength region and transmits light in the visible light wavelength region is overlapped and provided. In other words, the infrared cut filter layer 142 is provided on a top surface of a region where color filter layers 138a to 138c are provided and is not provided on a top surface of a region where the infrared pass filter 140 is provided. That is, the infrared cut filter layer 142 has an opening part on the region where the photodiode 136d is provided.

As shown in FIG. 2, a first cured film 144a is provided between the color filter layers 138a to 138c and the infrared cut filter layer 142. By providing the first cured film 144a, surface irregularity of the color filter layers 138a to 138c is absorbed and the infrared cut filter layer 142 may be provided on a flat surface. Thus, the infrared cut filter layer 142 may be thinned.

On a top surface of the infrared cut filter layer 142, a second cured film 144b is further provided. The infrared cut filter layer 142 is provided on light-receiving surfaces of the photodiodes 136a to 136c but is not provided on a light-receiving surface of the photodiode 136d. Therefore, a step part due to the infrared cut filter layer 142 is formed. However, by providing the second cured film 144b, the step part is buried and an undercoat surface of the micro-lens array 134 may be flattened.

The micro-lens array 134 is provided on a top surface of the optical filter layer 132. In the micro-lens array 134, a position of individual micro-lens corresponds to a position of each of the pixels, incident light collected by each micro-lens is received by each of the corresponding pixels (specifically, individual photodiodes). The micro-lens array 134 may be formed with a resin material, therefore, may be formed on-chip. For example, the micro-lens array 134 may be formed by processing the resin material applied on the second cured film 144b.

The solid-state imaging device 100 according to the present embodiment is provided with a structure capable of imaging by stacking the semiconductor layer 128, the wiring layer 130, the optical filter layer 132 and the micro-lens array 134 on the substrate 126. In what follows, the optical filter layer 132 will be detailed.

1-2. Color Filter Layer

The color filters 138a to 138c each is a pass filter that transmits visible light in respectively different wavelength bands. For example, the color filter layer 138a, the color filter layer 138b and the color filter layer 138c may be formed from a pass filter that transmits light in a wavelength band of red color light (substantial wavelength: 610 to 780 nm), a pass filter that transmits light in a wavelength band of green color light (substantial wavelength: 500 to 570 nm) and a pass filter that transmits light in a wavelength band of blue color light (substantial wavelength: 430 to 460 nm), respectively. In the photodiodes 136a to 136c, transmitted lights of the color filter layers 138a to 138c are input respectively. Accordingly, the respective pixels (first pixels) may be also separated into a first pixel 122a for detecting red light, a first pixel 122b for detecting green light, and a first pixel 122c for detecting blue light.

The color filter layers 138a to 138c may be formed by adding a pigment (colorant or dye) having an absorption in a specific wavelength band to a resin material such as a binder resin and a curing agent. The pigment contained in the resin material may be one kind or a combination of a plurality of kinds.

If the photodiodes 136a to 136c are a silicon photodiode, the silicon photodiode has sensitivity over a broad range from a visible light wavelength region to an infrared wavelength region. Therefore, by providing color filter layers 138a to 138c corresponding to the photodiodes 136a to 136c, first pixels 122a to 122c corresponding to the respective colors may be provided in the pixel part 102a.

1-3. Infrared Pass Filter Layer

The infrared pass filter layer 140 is a pass filter that transmits light in at least a near-infrared wavelength region. The infrared pass filter layer 140 may be formed by adding a pigment (colorant or dye) having an absorption in a wavelength of the visible light wavelength region to the binder resin or a polymerizable compound. The infrared pass filter layer 140 has spectroscopic transmission characteristics such that it absorbs (cuts) light of shorter than substantially 700 nm, preferably shorter than 750 nm, and more preferably shorter than 800 nm, and transmits light of 700 nm or longer, preferably 750 nm or longer, and more preferably 800 nm or longer.

The infrared pass filter layer 140 may make near-infrared light enter the photodiode 136*d* by blocking light of shorter than a predetermined wavelength (for example, a wavelength of shorter than 750 nm) and by transmitting near-infrared light in a predetermined wavelength region (for example, 750 to 950 nm) as described above. Thus, the photodiode 136*d* may detect infrared light with high accuracy without being influenced by noise caused by visible light or the like. Thus, by providing the infrared pass filter layer 140, the second pixel 124 may be used as the infrared light detection pixel 120. The infrared pass filter layer 140 may be formed using a photosensitive composition described in, for example, JP2014-130332A.

1-4. Infrared Cut Filter Layer

The infrared cut filter layer 142 is a pass filter that transmits light in the visible light wavelength region and blocks light in the infrared wavelength region. The infrared cut filter layer 142 contains preferably a compound having a maximum absorption wavelength in the range of wavelength of from 600 to 2000 nm (hereinafter, referred to also as "an infrared-absorbing agent"), and may be formed by using an infrared-absorbing composition containing, for example, an infrared-absorbing agent and at least one kind selected from the binder resin and the polymerizable compound.

1-4-1. Infrared-Absorbing Agent

As the infrared-absorbing agent, at least one kind of compound selected from the group consisting of, for example, diiminium-based compounds, squarylium-based compounds, cyanine-based compounds, phthalocyanine-based compounds, naphthalocyanine-based compounds, quaterrylene-based compounds, aminium-based compounds, iminium-based compounds, azo-based compounds, anthraquinone-based compound, porphyrine-based compounds, pyrrolopyrrole-based compounds, oxonol-based compounds, croconium-based compound, hexaphyrin-based compounds, metal dithiol-based compounds, copper compounds, tungsten compounds and metal borides may be used. These may be used singularly or in a combination of two or more kinds.

Compounds that may be used as the infrared-absorbing agent are illustrated below.

Specific examples of the diiminium (diimmonium)-based compounds include compounds described in JPH01-113482A1, JPH10-180922A1, WO2003/5076A1, WO2004/48480A1, WO2005/44782A1, WO2006/120888A1, JP2007-246464A1, WO2007/148595A1, JP2011-038007A1 and paragraph [0118] of WO2011/118171A1 or the like. Examples of commercially available products include EPOLIGHT series such as EPOLIGHT 1178 or the like (manufactured by Epolin Inc.), CIR-108X series and CIR-96X series such as CIR-1085 or the like (manufactured by Japan Carlit Co., Ltd.), and IRG022, IRG023 and PDC-220 (manufactured by Nippon Kayaku Co., Ltd.).

Specific examples of the squarylium-based compounds include compounds described in JP3094037B1, JPS60-228448A, JPH01-146846A1, JPH01-228960A1, paragraph [0178] of JP2012-215806A1 and the like.

Specific examples of the cyanine-based compounds include compounds described in paragraphs [0041] to [0042] of JP2007-271745A1, paragraphs [0016] to [0018] of JP2007-334325A1, JP2009-108267A1, JP2009-185161A1, JP2009-191213A1, paragraph [0160] of JP2012-215806A1, paragraphs [0047] to [0049] of JP2013-155353A1 or the like. Examples of commercially available products include Daito chmix 1371F (manufactured by DAITO CHEMIX Co., Ltd.), NK series such as NK-3212, NK-5060 or the like (manufactured by Hayashibara Co., Ltd.) and the like.

Specific examples of the phthalocyanine-based compounds include compounds described in JPS60-224589A1, JP2005-537319A1, JPH04-23868A1, JPH04-39361A1, JPH05-78364A1, JPH05-222047A1, JPH05-222301A1, JPH05-222302A1, JPH05-345861A1, JPH06-25548A1, JPH06-107663A1, JPH06-192584A1, JPH06-228533A1, JPH07-118551A1, JPH07-118552A1, JPH08-120186A1, JPH08-225751A1, JPH09-202860A1, JPH10-120927A1, JPH10-182995A1, JPH11-35838A1, JP2000-26748A1, JP2000-63691A1, JP2001-106689A1, JP2004-18561A1, JP2005-220060A1, JP2007-169343A1, paragraphs [0026] to [0027] of JP2013-195480A1 and the like. Examples of commercially available products include FB series such as FB-22, 24 and the like (manufactured by YAMADA CHEMICAL CO., LTD.), Excolor series, Excolor TX-EX 720, Excolor TX-EX 708K (manufactured by NIPPON SHOKUBAI CO., LTD.), Lumogen IR788 (manufactured by BASF), ABS643, ABS654, ABS667, ABS670T, IRA693N, and IRA735 (manufactured by Exciton Inc.), SDA3598, SDA6075, SDA8030, SDA8303, SDA8470, SDA3039, SDA3040, SDA3922 and SDA7257 (manufactured by H. W. SANDS), TAP-15 and IR-706 (manufactured by YAMADA CHEMICAL CO., LTD.), and the like.

Specific examples of the naphthalocyanine-based compounds include compounds described in 111-152413A, JPH11-152414A1, JPH11-152415A1, paragraphs [0046] to [0049] of JP2009-215542A1 and the like.

Specific examples of the quaterrylene-based compounds include compounds described in paragraph [0021] of JP2008-009206A1 and the like. Examples of commercially available products include Lumogen IR765 (manufactured by BASF) and the like.

Specific examples of the aminium-based compounds include compounds described in paragraph [0018] of 108-027371A, JP2007-039343A1 and the like. Examples of commercially available products include IRG002 and IRG003 (manufactured by Nippon Kayaku Co., Ltd.) and the like.

Specific examples of the iminium-based compounds include compounds described in paragraph [0116] of WO2011/118171A1 and the like.

Specific examples of the azo-based compounds include compounds described in paragraphs [0114] to [0117] of JP2012-215806A1 and the like.

Specific examples of the anthraquinone-based compounds include compounds described in paragraphs [0128] and [0129] of JP2012-215806A1 and the like.

Specific examples of the porphyrin-based compounds include compounds represented by a formula (1) of JP3834479B1.

Specific examples of the pyrrolopyrrole-based compounds include compounds described in JP2011-068731A1, paragraphs [0014] to [0027] of JP2014-130343A1 and the like.

Specific examples of the oxonol-based compounds include compounds described in paragraph [0046] of JP2007-271745A1 and the like.

Specific examples of the croconium-based compounds include compounds described in paragraph [0049] of JP2007-271745A1, JP2007-31644A1, JP2007-169315A1 and the like.

Specific examples of the hexaphyrin-based compounds include compounds represented by a formula (1) of WO2002/016144A1 pamphlet.

Specific examples of the metal dithiol-based compounds include compounds described in JPNo.H01-114801A1, JPS64-74272A1, JPS62-39682A1, JPS61-80106A1, JPS61-42585A1, JS61-32003A1 and the like.

The copper compound is preferably a copper complex, and specific examples of the copper complexes include compounds described in JP2013-253224A1, JP2014-032380A1, JP2014-026070A1, JP2014-026178A1, JP2014-139616A1, JP2014-139617A1 and the like.

As the tungsten compound, a tungsten oxide compound is preferable, cesium tungsten oxide and rubidium tungsten oxide are more preferable, and cesium tungsten oxide still more preferable. As a compositional formula of the cesium tungsten oxide, $Cs_{0.33}WO_3$ or the like is cited, and as a compositional formula of the rubidium tungsten oxide, $Rb_{0.33}WO_3$ or the like may be cited. The tungsten oxide-based compound may be obtained, for example, also as a dispersion of tungsten fine particles such as YMF-02A manufactured by SUMITOMO METAL MINING CO., LTD.

Specific examples of the metal borides include compounds described in paragraph [0049] of JP2012-068418A1 and the like. Among these, lanthanum boride is preferable.

When the above-described infrared-absorbing agent is soluble in an organic solvent described below, it may be laked and used also as an infrared-absorbing agent insoluble in an organic solvent. As a method of laking, a well-known method may be used, for example, JP2007-271745A1 or the like may be referenced.

Among the infrared-absorbing agents like this, it is preferable to contain at least one kind selected from the group consisting of diimmonium-based compounds, squarylium-based compounds, cyanine-based compounds, phthalocyanine-based compounds, naphthalocyanine-based compounds, quaterrylene-based compounds, aminium-based compounds, iminium-based compounds, pyrrolopyrrole-based compounds, croconium-based compound, metal dithiol-based compounds, copper compounds and tungsten compounds. It is more preferable to contain at least one kind selected from the group consisting of diiminium-based compounds, squarylium-based compounds, cyanine-based compounds, phthalocyanine-based compounds, naphthalocyanine-based compounds, quaterrylene-based compounds, aminium-based compounds, iminium-based compounds, pyrrolopyrrole-based compounds, croconium-based compound, metal dithiol-based compounds, and copper compounds and a tungsten compound, or at least two or more kinds selected from the group consisting of diiminium-based compounds, squarylium-based compounds, cyanine-based compounds, phthalocyanine-based compounds, naphthalocyanine-based compounds, quaterrylene-based compounds, aminium-based compounds, iminium-based compounds, pyrrolopyrrole-based compounds, croconium-based compound, metal dithiol-based compounds, and copper compounds. According to the aspect like this, infrared light incident on the light-receiving element may be more effectively blocked.

In the infrared cut filter layer 142, when the kind and a content ratio of the infrared-absorbing agent are constant, as a film thickness is increased, an absorption performance of the infrared light may be improved. Thus, the solid-state imaging device may obtain a higher S/N ratio, and high sensitivity imaging may be realized. However, when the film thickness of the infrared cut filter layer 142 is increased, there is a problem that the solid-state imaging device 100 may not be thinned. When the infrared cut filter layer 142 is thinned to make the solid-state imaging device thinner, there is a problem that an infrared-blocking performance is deteriorated and the visible light detection pixel tends to be influenced by noise due to the infrared light.

On the other hand, when the content ratio of the infrared-absorbing agent is increased, a ratio of, for example, the polymerizable compound that is another component of forming the infrared cut filter layer decreases to degrade the hardness of the infrared cut filter layer 142. Then, the optical filter layer 132 becomes brittle to cause peeling of a layer in contact with the infrared cut filter layer 142 or generate crack. There is a problem that, for example, the adhesiveness with the first cured film 144a and the second cured film 144b in contact with the infrared cut filter layer 142 decreases to tend to cause the peeling.

A ratio of the infrared-absorbing agent selected from the above is a ratio of preferably 0.1 to 80% by mass, more preferably 0.1 to 70% by mass, and still more preferably 3 to 60% by mass in the infrared cut filter layer 142. When the compound is contained in the range like this, even when the film thickness of the infrared cut filter layer 142 is thinned, the infrared cut filter layer 142 that may sufficiently absorb the infrared light may be prepared.

A preferable content ratio of the infrared-absorbing agent to a total solid content mass of the infrared-absorbing composition when an infrared cut filter is prepared using the infrared-absorbing composition is the same as the ratio of the infrared-absorbing agent in the infrared cut filter layer 142. The solid content in this case is a component other than the solvent, which constitutes the infrared-absorbing composition.

In what follows, other components that constitute the infrared-absorbing composition that may be suitably used to prepare the infrared cut filter layer 142 according to the present invention will be described.

1-4-2. Binder Resin

The infrared-absorbing composition preferably contains the binder resin. The binder resin is not particularly limited, but at least one kind selected from the group consisting of an acrylic resin, a polyimide resin, a polyamide resin, a polyurethane resin, an epoxy resin and polysiloxane is preferable.

First, the acrylic resin will be described. Among the acrylic resins, acrylic resins having an acidic functional group such as a carboxyl group and a phenolic hydroxyl group are preferable. In the case where, by using the acrylic resin having the acidic functional group, the infrared cut filter layer obtained from the infrared-absorbing composition is exposed to form into a predetermined pattern, an unexposed part may be more surely removed with an alkali development liquid, thus, a more excellent pattern may be formed by alkali development. As the acrylic resin having the acidic functional group, a polymer having a carboxyl group (hereinafter, referred to also as "carboxyl group-containing polymer") is preferable, for example, a copolymer of an ethylenically unsaturated monomer having one or more carboxyl groups (hereinafter, referred to also as "unsaturated monomer (1)") and another copolymerizable ethylenically unsaturated monomer (hereinafter, referred to also as "unsaturated monomer (2)") may be used.

Examples of the unsaturated monomer (1) described above include (meth)acrylic acid, maleic acid, maleic anhydride, mono(2-(meth)acryloyloxyethyl)succinate, ω-carboxypolycaprolactone mono(meth)acrylate, and p-vinyl benzoic acid. These unsaturated monomers (1) can be used singularly or in a combination of two or more kinds.

Further, examples of the unsaturated monomer (2) described above include N-site substituted maleimide such as N-phenylmaleimide and N-cyclohexylmaleimide; aromatic vinyl compounds such as styrene, α-methylstyrene, p-hydroxystyrene, p-hydroxy-α-methylstyrene, p-vinylbenzylglycidyl ether and acenaphthylene; alkyl (meth)acrylates such as methyl(meth)acrylate, n-butyl(meth)acrylate, and 2-ethylhexyl(meth)acrylate; hydroxylalkyl (meth)acrylates such as 2-hydroxyethyl(meth)acrylate and 2-hydroxypropyl (meth)acrylate; (meth)acrylic acid esters of unsaturated alcohol such as vinyl (meth)acrylate and allyl(meth)acrylate; aryl (meth)acrylates such as phenyl (meth)acrylate and benzyl (meth)acrylate; (meth)acrylic acid esters of polyalcohol such as polyethylene glycol (degree of polymerization: 2 to 10) methyl ether (meth)acrylate, polypropylene glycol (degree of polymerization: 2 to 10) methyl ether (meth)acrylate, polyethylene glycol (degree of polymerization: 2 to 10) mono (meth)acrylate, polypropylene glycol (degree of polymerization: 2 to 10) mono (meth)acrylate and glycerol mon(meth)acrylate; (meth)acrylic esters having an alicyclic hydrocarbon group such as cyclohexyl (meth)acrylate, isobornyl(meth)acrylate, tricyclo[5.2.1.0$^{2,6}$]decan-8-yl(meth)acrylate and dicyclopentenyl (meth)acrylate; (meth)acrylic acid esters of aryl alcohol such as 4-hydroxyphenyl (meth)acrylate, ethylene oxide-modified (meth)acrylate of paracumylphenol; vinyl ethers such as cyclohexyl vinyl ether, isobornyl vinyl ether, tricyclo[5.2.1.0$^{2,6}$]decan-8-yl vinyl ether, pentacyclopentadecanyl vinyl ether, and 3-(vinyloxymethyl)-3-ethyl oxetane; macromonomers having a mono(meth)acrylloyl group at a terminal of a polymer molecule chain such as polystyrene, poly ethyl (meth)acrylate, poly-n-butyl(meth)acrylate and polysiloxane; and conjugated diene compounds such as 1,3-butadiene and the like.

Further, as the unsaturated monomer (2), (meth)acrylic acid ester having an oxygen-containing saturated heterocyclic group may be also used. Here, the "oxygen-containing saturated heterocyclic group" means a saturated heterocyclic group having an oxygen atom as a heteroatom that constitutes a heterocycle, and a cyclic ether group having 3 to 7 atoms that constitute the ring is preferred. Examples of the cyclic ether groups include an oxiranyl group, an oxetanyl group and a tetrahydrofuranyl group. Among these, the oxiranyl group and the oxetanyl group are preferable, and the oxiranyl group is more preferable.

Examples of the (meth)acrylic acid esters having an oxygen-containing saturated heterocyclic group include (meth)acrylic acid esters having the oxiranyl group such as glycidyl (meth)acrylate, 2-hydroxyethyl (meth)acrylate glycidyl ether, 2-hydroxypropyl (meth)acrylate glycidyl ether, 3-hydroxypropyl (meth)acrylate glycidyl ether, 4-hydroxybutyl (meth)acrylate glycidyl ether, polyethylene glycol-polypropylene glycol (meth)acrylate glycidyl ether and 3,4-epoxycyclohexyl methyl (meth)acrylate; (meth)acrylic acid esters having the oxetanyl group such as 3-[(meth)acryloyloxymethyl]oxetane and 3-[(meth)acryloyloxymethyl]-3-ethyl oxetane; and (meth)acrylic acid esters having a tetrahydrofuranyl group such as tetrahydrofurfuryl methacrylate and the like.

Further, as the unsaturated monomer (2) described above, a (meth)acrylic acid ester having a block isocyanate group may be also used. The block isocyanate group detaches a block group by heating and is converted into an active isocyanate group abundant in reactivity. Thus, a cross-linking structure may be formed. Specific examples of the (meth)acrylic acid esters having a block isocyanate group include compounds described in paragraph [0024] of JP2012-118279A1. Among these, 2-(3, 5-dimethylpyrazolyl)carbonylaminoethyl methacrylate and 2-(1-methylpropylidene aminooxycarbonylamino)ethy methacrylate are preferable.

These unsaturated monomers (2) may be used singularly or in a combination of two or more kinds thereof.

In a copolymer of the unsaturated monomer (1) and the unsaturated monomer (2), a copolymerization ratio of the unsaturated monomer (1) in the copolymer is preferably 5 to 50% by mass, and more preferably 10 to 40% by mass. When the unsaturated monomer (1) is copolymerized in the range like this, an infrared-absorbing composition excellent in an alkali development performance and storage stability may be obtained.

Specific examples of the copolymers of the unsaturated monomer (1) and the unsaturated monomer (2) include copolymers disclosed in JPH07-140654A1, JPH08-259876A1, JPH10-31308A1, JPH10-300922A1, JPH11-174224A1, JPH11-258415A1, JP2000-56118A1, and JP2004-101728A1.

Further, as disclosed in JPH05-19467A1, JPH06-230212A1, JPH07-207211A1, JPH09-325494A1, JPH11-140144A1, and JP2008-181095A1, a carboxyl group-containing polymer having a polymerizable unsaturated group such as a (meth)acryloyl group or the like in a side chain may be also used as the binder resin. Thus, the infrared cut filter layer 142 excellent in the adhesiveness with the cured film may be formed.

As the carboxyl group-containing polymer having a polymerizable unsaturated group in a side chain, the copolymers of the following (a) to (d) may be used.

(a) A polymer obtained by reacting an unsaturated isocyanate compound with a copolymer of a monomer formed by containing the unsaturated monomer (1) and the polymerizable unsaturated compound having a hydroxyl group, (b) a (co)polymer obtained by reacting a polymerizable unsaturated compound having the oxiranyl group with a (co)polymer of a monomer formed by containing the unsaturated monomer (1), (c) a polymer obtained by reacting the unsaturated monomer (1) with a copolymer of a monomer formed by containing the polymerizable unsaturated compound having the oxiranyl group and the unsaturated monomer (1), and (d) a (co)polymer obtained by reacting the unsaturated monomer (1) with a (co)polymer of a monomer formed by containing the polymerizable unsaturated compound having the oxiranyl group, followed by reacting a polybasic acid anhydride.

In the present specification, the "(co)polymer" is a term including a polymer and a copolymer.

As the polymerizable unsaturated compound having a hydroxyl group, compounds having a hydroxyl group and an ethylenically unsaturated group in a molecule such as the hydroxy alkyl(meth)acrylate may be used. As the unsaturated isocyanate compound, other than 2-(meth)acryloyloxyphenyl isocyanate, compounds described in paragraph [0049] of JP2014-098140A1 may be used. As the polymerizable unsaturated compound having the oxiranyl group, the (meth)acrylic acid ester having the oxiranyl group may be used. As the polybasic acid anhydride, other than anhydride of dibasic acid and tetrabasic acid dianhydride illustrated in a place where polymerizable compounds are described below, compounds described in paragraph [0038] of JP2014-142582A1 may be used.

The acrylic resin has a weight average molecular weight (Mw) in terms of polystyrene measured by gel permeation chromatography (hereinafter, abbreviated as "GPC") usually of 1,000 to 100,000, preferably of 3,000 to 50,000, and more preferably of 5,000 to 30,000. Further, a ratio (Mw/Mn) of Mw and the number average molecular weight (Mn) is usually 1.0 to 5.0, and preferably 1.0 to 3.0. By taking aspect like this, the infrared cut filter excellent in the curability and adhesiveness may be formed. The Mw and Mn here respectively mean the weight average molecular weight and number average molecular weight in terms of polystyrene, which are measured by GPC (elusion solvent: tetrahydrofuran).

An acid value of the acrylic resin having an acidic functional group is preferably 10 to 300 mg KOH/g, more preferably 30 to 250 mg KOH/g, and still more preferably 50 to 200 mg KOH/g from the viewpoint of the adhesiveness with the cured film. By such aspect, since the infrared cut filter layer having a low contact angle and excellent wettability may be formed, the adhesiveness with the cured film may be enhanced. Here, the "acid value" in the present specification is the number of mg of KOH necessary to neutralize 1 g of the acrylic resin having the acidic functional group.

Although the acrylic resin may be manufactured according to a well-known method, its structure, Mw and Mw/Mn may be also controlled by a method disclosed in, for example, JP2003-222717A1, JP2006-259680A1, or a pamphlet of WO2007/029871A1.

Among the acrylic resins, any one of the following (1-I) to (1-IV) is preferable.

(1-I) A copolymer between an ethylenically unsaturated monomer having one or more carboxyl groups and a (meth) acrylic acid ester having an oxygen-containing saturated heterocyclic group, (1-II) a copolymer between the ethylenically unsaturated monomer having one or more carboxyl groups and a (meth) acrylic acid ester having a block isocyanate group, (1-III) a carboxyl group-containing polymer having a (meth)acryloyl group in a side chain, and (1-IV) a copolymer between the ethylenically unsaturated monomer having one or more carboxyl groups and another polymerizable ethylenically unsaturated monomer, which has the acid value of 10 to 300 mg KOH/g.

A preferable aspect in these (1-I) to (1-IV) is respectively as described above.

Next, the polyamide resin and the polyimide resin will be described. As the polyamide resin, polyamide acid (polyamic acid) may be used. Further, as the polyimide resin, a silicon-containing polyimide resin, a polyimide siloxane resin and a polymaleimide resin or the like may be used, and, these may be formed by imidizing, for example, the polyamic acid as a precursor by thermal ring-closing reaction. Specific examples of the polyamide resins and the polyimide-based resins include compounds described in paragraphs [0118] to [0120] of JP2012-189632A1.

The polyurethane resin is not particularly restricted as long as it has a urethane bond as a repeating unit, and may be generated due to a reaction between a diisocyanate compound and a diol compound. As the diisocyanate compound, compounds described in paragraph [0043] of JP2014-189746A1 may be used. As the diol compound, for example, compounds described in paragraph of JP2014-189746A1 may be used.

Examples of the epoxy resins include a bisphenol type epoxy resin, a hydrogenated bisphenol type epoxy resin, and a novolak type epoxy resin, among these, the bisphenol type epoxy resin and the novolak type epoxy resin are preferable. Among the preferable epoxy resins, as the bisphenol type epoxy resin, a bisphenol A type epoxy resin, a bisphenol F type epoxy resin, a brominated bisphenol A type epoxy resin and a bisphenol S type epoxy resin may be used. Further, as the novolak type epoxy resin, a phenol novolak type epoxy resin and a cresol novolak type epoxy resin may be used.

Such epoxy resins may be commercially available, and, for example, commercial products described in paragraph [0121] of JP5213944B1 may be used.

The polysiloxane is preferably a hydrolysis condensation product of a hydrolyzable silane compound. Specifically, a hydrolysis condensation product of a hydrolysable silane compound represented by the following formula (1) may be used.

$$Si(R^1)_x(OR^2)_{4-x} \qquad (1)$$

In the formula (1), x represents an integer of from 0 to 3, and $R^1$ and $R^2$ represent mutually independently a monovalent organic group.

As the monovalent organic group in $R^1$ and $R^2$, a substituted or unsubstituted aliphatic hydrocarbon group, a substituted or unsubstituted alicyclic hydrocarbon group and a substituted or unsubstituted aromatic hydrocarbon group may be used. The "alicyclic hydrocarbon" indicates a hydrocarbon group without a ring structure.

As a substituent group in the aliphatic hydrocarbon group, the alicyclic hydrocarbon group and the aromatic hydrocarbon group, the oxiranyl group, the oxetanyl group, an episulfide group, a vinyl group, an allyl group, a (meth) acryloyl group, a carboxyl group, a hydroxyl group, a sulfanyl group, an isocyanate group, an amino group, and an ureido group may be used. Among these, at least one kind of a substituent group selected from the group consisting of the oxiranyl group, the (meth)acryloyl group and the sulfanyl group is preferable.

Specific examples of such hydrolyzable silane compounds include compounds described in paragraphs [0047] to [0051] and paragraphs [0060] to of JP2010-055066A1. Further, examples of the hydrolyzable silane compounds having the substituent group include hydrolyzable silane compounds described in paragraphs [0077] to [0088] of JP2008-242078A1. Other than these, hexa-functional hydrolyzable silane compounds such as bis(trimethoxysilyl)methane, bis(triethoxysilyl)methane, 1,2-bis(trimethoxysilyl)ethane, 1,2-bis(triethoxysilyl)ethane and 1,8-bis(triethoxysilyl) octane may be also used together.

The polysiloxanes may be synthesized according to the well-known method. The Mw due to the GPC is usually 500 to 20,000, preferably 1,000 to 10,000, more preferably 1,500 to 7,000, and still more preferably 2,000 to 5,000. Further, the Mw/Mn is preferably 1.0 to 4.0 and more preferably 1.0 to 3.0. According to the aspect like his, excellent coating properties and sufficient adhesiveness may be developed.

In one embodiment of the present invention, the binder resins may be used singularly or in a combination of two or more kinds. Among these, from the viewpoint of forming an infrared cut filter layer excellent in the adhesiveness with a cured film, as the binder resin that constitutes the infrared-absorbing composition, an acrylic resin, a polyimide resin, a polyamide resin, an epoxy resin and polysiloxane are preferable, the acrylic resin, the polyimide resin, the polyamide resin and the epoxy resin are more preferable and the acrylic resin is still more preferable.

In one embodiment of the present invention, a content of the binder resin is usually 5 to 1,000 parts by mass, preferably 10 to 500 parts by mass, and more preferably 20 to 150 parts by mass relative to 100 parts by mass of the infrared-absorbing agent. By taking the aspect like this, the infrared-absorbing composition having excellent coating properties and storage stability may be obtained, and, when alkali developability is imparted, the infrared-absorbing composition having excellent alkali developability may be formed.

1-4-3. Polymerizable Compound

The infrared-absorbing composition preferably contains a polymerizable compound (However, the binder resin is omitted.). The polymerizable compound in the present specification means a compound having two or more polymerizable groups. A molecular weight of the polymerizable compound is 4,000 or smaller, further 2,500 or smaller, and preferably 1,500 or smaller. Examples of the polymerizable group include an ethylenically unsaturated group, an oxiranyl group, an oxetanyl group, an N-hydroxymethylamino group and an N-alkoxy methyl amino group. In the present invention, as the polymerizable compound, a compound having two or more (meth)acryloyl groups, or a compound having two or more N-alkoxy methyl amino groups is preferable.

Among the preferable compounds in the polymerizable compounds, specific examples of the compound having two or more (meth)acryloyl groups include a polyfunctional (meth)acrylate obtained by reacting an aliphatic polyhydroxy compound and (meth)acrylic acid, a polyfunctional (meth)acrylate modified with caprolactone, a polyfunctional (meth)acrylate modified with alkylene oxide, a polyfunctional urethane(meth)acrylate obtained by reacting a (meth) acrylate having a hydroxyl group and a polyfunctional isocyanate, and a polyfunctional (meth)acrylate having a carboxyl group obtained by reacting a (meth)acrylate having a hydroxyl group and an acid anhydride.

Here, examples of the aliphatic polyhydroxy compound include: divalent aliphatic polyhydroxy compounds such as ethylene glycol, propylene glycol, polyethylene glycol and polypropylene glycol; and tri- or more valent aliphatic polyhydroxy compounds such as glycerin, trimethylol propane, pentaerythritol, and dipentaerythritol. Examples of the (meth)acrylate having a hydroxyl group include 2-hydroxyethyl (meth)acrylate, trimethylol propane di(meth)acrylate, pentaerythritol tri(meth)acrylate, dipentaerythritol penta(meth)acrylate, glycerol dimethacrylate and the like. Examples of the polyfunctional isocyanate include tolylene diisocyanate, hexamethylene diisocyanate, diphenylmethylene diisocyanate, isophorone diisocyanate and the like. Examples of the acid anhydride include anhydrides of dibasic acid such as succinic anhydride, maleic anhydride, glutaric anhydride, itaconic anhydride, phthalic anhydride, and hexahydrophthalic anhydride, and dianhydride of tetrabasic acid such as pyromellitic anhydride, dianhydride of biphenyl tetracarboxylic acid, and dianhydride of benzophenone tetracarboxylic acid.

Further, examples of the caprolactone-modified polyfunctional (meth)acrylate include compounds described in paragraphs [0015] to [0018] of JPH11-44955A1. Examples of the alkylene oxide-modified polyfunctional (meth)acrylate include bisphenol A di(meth)acrylate modified by at least one kind selected from ethylene oxide and propylene oxide, isocyanuric acid tri(meth)acrylate modified by at least one kind selected from ethylene oxide and propylene oxide, trimethylolpropane tri(meth)acrylate modified by at least one kind selected from ethylene oxide and propylene oxide, pentaerythritol tri(meth)acrylate modified by at least one kind selected from ethylene oxide and propylene oxide, pentaerythritol tetra(meth)acrylate modified by at least one kind selected from ethylene oxide and propylene oxide, dipentaerythritol penta(meth)acrylate modified by at least one kind selected from ethylene oxide and propylene oxide, dipentaerythritol hexa(meth)acrylate modified by at least one kind selected from ethylene oxide and propylene oxide and the like.

Further, examples of the compound having two or more N-alcoxymethyl amino group include compounds having a melamine structure, a benzoguanamine structure, or a urea structure. The melamine structure and the benzoguanamine structure mean a chemical structure having one or more triazine rings or phenyl-substituted triazine rings as a basic skeleton and are a conception including melamine, benzoguanamine or condensates thereof. Specific examples of compounds having two or more N-alkoxy methyl amino groups include N, N, N', N', N", N"'-hexa(alkoxymethyl) melamine, N, N, N', N'-tetra(alkoxymethyl)benzoguanamine, N, N, N', N'-tetra(alkoxymethyl)glycoluril and the like.

Other than the above, as the polymerizable compound, an aliphatic compound having an epoxy group and an alicyclic compound having an epoxy group may be also used. As the aliphatic compound having an epoxy group, aliphatic compounds having 2 to 4 epoxy groups are preferable, and, specifically, compounds described in paragraph [0042] of JP2010-053330A1 may be used. As the alicyclic compound having an epoxy group, an alicyclic compound having 2 to 4 epoxy groups is preferable, and, specifically, compounds described in paragraph [0043] of JP2010-053330A1 may be used. Further, a compound having two or more N-hydroxymethyl amino group such as hexamethylolmelamine may be used.

Among these polymerizable compounds, the compound having two or more (meth)acryloyl groups and the compound having two or more N-alkoxymethyl amino groups are preferable, a polyfunctional (meth)acrylate obtained by reacting a tri- or more valent aliphatic polyhydroxy compound and (meth)acrylic acid, a polyfunctional (meth)acrylate modified with caprolactone, a polyfunctional (meth) acrylate modified with alkylene oxide, a polyfunctional urethane (meth)acrylate, a polyfunctional (meth)acrylate having a carboxyl group, N, N, N', N', N", N"'-hexa (alkoxymethyl)melamine and N, N, N', N'-tetra(alkoxymethyl)benzoguanamine are more preferable, and a polyfunctional (meth)acrylate obtained by reacting tri- or more valent aliphatic polyhydroxy compound and (meth)acrylic acid, a polyfunctional (meth)acrylate modified with alkylene oxide, a polyfunctional urethane (meth)acrylate and a polyfunctional (meth)acrylate having a carboxyl group are still more preferable. Among the polyfunctional (meth)acrylates obtained by reacting tri- or more valent aliphatic polyhydroxy compound and (meth)acrylic acid, trimethylolpropane triacrylate, pentaerythritol triacrylate, dipentaerythritol pentaacrylate and dipentaerythritol hexaacrylate, among polyfunctional (meth)acrylates modified with alkylene oxide, trimethylolpropane tri(meth)acrylate modified with at least one kind selected from ethylene oxide and propylene oxide, pentaerythritol tetra(meth)acrylate modified with at least one kind selected from ethylene oxide and propylene oxide, dipentaerythritol penta(meth)acrylate modified with at least one kind selected from ethylene oxide and propylene oxide, and dipentaerythritol hexa(meth)acrylate modified with at least one kind selected from ethylene oxide and propylene oxide, among the polyfunctional (meth)acrylate having a carboxyl group, a compound obtained by reacting pentaerythritol triacrylate and succinic anhydride and a compound obtained by reacting dipentaerythritol pentaacrylate and succinic anhydride are excellent in strength and surface smoothness of the infrared cut filter, and, when the alkali developability is imparted to the infrared-absorbing composition, are particularly preferable in the points of being less likely to generate scumming on a substrate of an unexposed part, film residue or the like. In one embodiment of the present invention, the polymerizable compounds may be used singularly or in a mixture of two or more kinds.

A content of the polymerizable compound in one embodiment of the present invention is preferably from 10 to 1,000 parts by mass, more preferably from 15 to 500 parts by mass and still more preferably from 20 to 150 pats by mass relative to 100 part by mass of the infrared-absorbing agent. By adopting such aspect, the curability and the adhesiveness may be further enhanced.

1-4-4. Solvent

The infrared-absorbing composition is usually prepared as a liquid composition by blending a solvent. The solvent may be used by appropriately selecting, as long as it disperses or dissolves components that constitute the infrared-absorbing composition, does not reacts with these components and has appropriate volatility.

As the solvent like this, for example, (poly)alkylene glycol monoalkyl ethers such as ethylene glycol monomethyl ether, ethylene glycol monoethyl ether, ethylene glycol mono-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, and tripropylene glycol monoethyl ether; alkyl lactates such as methyl lactate and ethyl lactate; (cyclo) alkyl alcohols such as methanol, ethanol, propanol, butanol, isopropanol, isobutanol, t-butanol, octanol, 2-ethylhexanol and cyclohexanol; keto alcohols such as diacetone alcohol; (poly) alkylene glycol monoalkyl ether acetates such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate, propylene glycol monoethyl ether acetate, dipropylene glycol monomethyl ether acetate, methoxybutyl acetate and 3-methyl-3-methoxybutyl acetate; other ethers such as diethylene glycol dimethyl ether, diethylene glycol methyl ethyl ether, diethylene glycol diethyl ether, and tetrahydrofuran; ketones such as methyl ethyl ketone, cyclohexanone, cyclopentanone, 2-heptanone and 3-heptanone; diacetates such as propylene glycol diacetate, 1,3-butylene glycol diacetate and 1,6-hexanediol diacetate; alkoxy carboxylic acid esters such as methyl 3-methoxypropionate, ethyl 3-methoxy propionate, methyl 3-ethoxypropionate, ethyl 3-ethoxypropionate, ethyl ethoxy acetate and 3-methyl-3-methoxybutyl propionate; other esters such as ethyl acetate, n-propyl acetate, i-propyl acetate, n-butyl acetate, i-butyl acetate, n-amyl formate, i-amyl acetate, n-butyl propionate, ethyl butyrate, n-propyl butyrate, i-propyl butyrate, n-propyl butyrate, methyl pyruvate, ethyl pyruvate, n-propyl pyruvate, methyl acetoacetate, ethyl acetoacetate and ethyl 2-oxobutanoate; aromatic hydrocarbons such as toluene and xylene; and amides or lactams such as N, N-dimethylformamide, N, N-dimethylacetamide and N-methyl pyrrolidone may be used.

Among these solvents, from the viewpoint of solubility, coating properties and the like, (poly)alkylene glycol monoalkyl ethers, alkyl lactates, (poly)alkylene glycol monoalkyl ether acetates, other ethers, ketones, diacetates, alkoxy carboxylic acid esters, and other esters are preferable, particularly, propylene glycol monomethyl ether, propylene glycol monoethyl ether, ethylene glycol monomethyl ether acetate, propylene glycol monomethyl ether acetate, propylene glycol monoethyl ether acetate, 3-methoxybutyl acetate, diethylene glycol dimethyl ether, diethylene glycol methyl ethyl ether, cyclohexanone, 2-heptanone, 3-heptanone, 1,3-butylene glycol diacetate, 1,6-hexanediol diacetate, ethyl lactate, ethyl 3-methoxy propionate, methyl 3-ethoxypropionate, ethyl 3-ethoxypropionate, 3-methyl-3-methoxybutyl propionate, n-butyl acetate, i-butyl acetate, n-amyl formate, i-amyl acetate, n-butyl propionate, ethyl butyrate, i-propyl butyrate, n-butyl butyrate and ethyl pyruvate are preferable.

In one embodiment of the present invention, the solvents may be used singularly or in a combination of two or more kinds.

Although a content of the solvent is not particularly limited, a total concentration of the respective components excluding the solvent of the infrared-absorbing composition is preferably an amount of from 5 to 50% by mass and more preferably an amount of from 10 to 30% by mass. By adopting such aspect, the infrared-absorbing composition having excellent coating properties may be obtained.

1-4-5. Photosensitizing Agent

The infrared-absorbing composition of the present invention may contain a photosensitizing agent. Here, the "photosensitizing agent" in the present specification means a compound having a property that changes the solubility of the infrared-absorbing composition to the solvent by light irradiation. As such compound, for example, a photopolymerization initiator, an acid-generating agent and the like may be used. The photosensitizing agents may be used singularly or in a combination of two or more kinds thereof.

The photopolymerization initiator is not particularly limited as long as it may generate an acid or a radical by light, and examples of the photopolymerization initiator include a thioxanthone-based compound, an acetophenone-based compound, a biimidazole-based compound, a triazine-based compound, an O-acyloxim-based compound, an onium salt-based compound, a benzoin-based compound, a benzophenone-based compound, an α-diketone-based compound, a polynuclearquinone-based compound, a diazo-based compound and an imidosulfonate-based compound. The photopolymerization initiators may be used singularly or in a combination of two or more kinds thereof.

Among these, as the photopolymerization initiator, at least one kind selected from the group of the biimidazole-based compound, the thioxanthone-based compound, the acetophenone-based compound, the triazine-based compound and the O-acyloxim-based compound is preferred. When the biimidazole-based compound is used, a hydrogen donor such as 2-mercaptobenzothiazole may be used together. The "hydrogen donor" here means a compound capable of donating a hydrogen atom to a radical generated from the biimidazole-based compound by exposure. Further, in the case where the photopolymerization initiator other than the biimidazole-based compound is used, a sensitizer such as ethyl 4-dimethylamino benzoate may be used together.

The acid-generating agent is not particularly limited as long as it may generate an acid by heat or light, and examples of the acid-generating agent include sulfonium salts, benzothiazolium salts, ammonium salts, onium salts such as phosphonium salts, N-hydroxyimide sulfonate compounds, oxime sulfonate, 0-nitrobenzyl sulfonate and quinonediazide compounds. The acid-generating agents may be used singularly or in a combination of two or more kinds thereof. Among these, the sulfonium salts, the benzothiazolium salts, the oxime sulfonate, and the quinonediazide compounds are preferable. Specific examples of the sulfonium salts and the benzothiazolium salts include 4-acetoxyphenyl dimethyl sulfonium hexafluoroarsenate, 4-hydroxyphenyl-benzyl methyl sulfonium hexafluoroantimonate, 4-acetoxyphenyl benzyl methyl sulfonium hexafluoroantimonate, 4-hydroxyphenyl dibenzyl sulfonium hexafluoroantimonate, 4-acetoxyphenyl dibenzyl sulfonium hexafluoroantimonate, 3-benzyl-benzothiazolium hexafluoroantimonate and 1-(4,7-dibutoxy-1-naphthalenyl) tetrahydrothiophenium trifluoromethanesulfonate. Specific examples of the oxime sulfonate include compounds described in paragraphs [0122] to [0131] of JP2014-115438A1. Specific examples of the quinonediazide compound include compounds described in paragraphs [0040] to [0048] of JP2008-156393A1 and paragraphs [0172] to [0186] of JP2014-174406A1.

A content of the photosensitizing agent is preferably from 0.03 to 10% by mass, more preferably from 0.1 to 8% by mass, and furthermore preferably from 0.5 to 6% by mass, relative to a solid content of the infrared-absorbing composition. By adopting an aspect like this, the curability and adhesiveness may be further improved.

1-4-6. Dispersing Agent

In the infrared-absorbing composition, a dispersing agent may be contained. Examples of the dispersing agent include a urethane-based dispersing agent, a polyethyleneimine-based dispersing agent, a polyoxyethylene alkyl ether-based dispersing agent, a polyoxyethylene alkyl phenyl ether-based dispersing agent, a poly(alkylene glycol) diester-based dispersing agent, a sorbitan fatty acid ester-based dispersing agent, a polyester-based dispersing agent, and a (meth) acrylic dispersing agent, and, examples of commercially available products include: other than the (meth)acryl-based dispersing agents such as Disperbyk-2000, Disperbyk-2001, BYK-LPN6919, BYK-LPN21116 and BYK-LPN22102 (manufactured by BYK Co., Ltd.), the urethane-based dispersing agents such as Disperbyk-161, Disperbyk-162, Disperbyk-165, Disperbyk-167, Disperbyk-170 and Disperbyk-182 (manufactured by BYK Co., Ltd.), and Solsperse 76500 (manufactured by Lubrizol Corporation), the polyethyleneimine-based dispersing agents such as Solsperse 24000 (manufactured by Lubrizol Corporation) and the polyester-based dispersing agent such as Ajisper PB821, Ajisper PB822, Ajisper PB880 and Ajisper PB881 (manufactured by Ajinomoto Fine-Techno Co., inc.), BYK LPN21324 (manufactured by BYK Co., Ltd.) may be used.

Among these, when the alkali developability is imparted to the infrared-absorbing composition, from the viewpoint of forming an infrared cut filter layer 142 having little development residue, a dispersing agent containing a repeating unit having an alkylene oxide structure is preferable.

The dispersing agents may be used singularly or in a combination of two or more kids thereof. A content of the dispersing agent is preferably from 5 to 200 parts by mass, more preferably from 10 to 100 parts by mass, and furthermore preferably from 20 to 70 parts by mass, relative to a total solid content of 100 parts by mass of the infrared-absorbing composition.

1-4-7. Additive

As needs arise, various additives may be added to the infrared-absorbing composition. Examples of the additive include: fillers such as glass and alumina; high molecule compounds such as polyvinyl alcohol and poly(fluoroalkyl acrylates); surfactants such as a fluorinated surfactant and a silicone-based surfactant; adhesion accelerators such as vinyltrimethoxysilane, vinyltriethoxysilane, vinyl tris (2-methoxyethoxy) silane, N-(2-aminoethyl)-3-aminopropyl methyl dimethoxy silane, N-(2-aminoethyl)-3-aminopropyltriethoxysilane, 3-aminopropyltriethoxysilane, 3-glycidoxypropyltrimethoxysilane, 3-glycidoxypropylmethyldimethoxysilane; 2-(3,4-epoxycyclohexyl) ethyltrimethoxysilane, 3-chloropropyl methyl dimethoxy silane, 3-chloropropyl trimethoxy silane, 3-methacryloyloxy propyl trimethoxy silane and 3-mercaptopropyltrimethoxysilane; antioxidants such as 2,2-thiobis (4-methyl-6-t-butylphenol), 2,6-di-t-butylphenol, pentaerythritol tetrakis [3-(3,5-di-t-butyl-4-hydroxyphenyl) propionate], 3,9 bis [2-[3-(3-t-butyl-4-hydroxy-5-methylphenyl)-propionyloxy]-1,1-dimethylethyl]-2,4,8,10-tetraoxa-spiro [5•5] undecane and thiodiethylene bis [3-(3,5-di-t-butyl-4-hydroxyphenyl) propionate]; ultraviolet absorbers such as 2-(3-t-butyl-5-methyl-2-hydroxy phenyl)-5-chloro-benzotriazole and alkoxy benzophenones; anti-agglomeration agents such as sodium polyacrylate; residue reducing agents such as malonic acid, adipic acid, itaconic acid, citraconic acid, fumaric acid, mesaconic acid, 2-aminoethanol, 3-amino-1-propanol, 5-amino-1-pentanol, 3-amino-1,2-propanediol; 2-amino-1,3-propanediol and 4-amino-1,2-butanediol; developability improvers such as mono [2-(meth) acryloyloxyethyl] succinate, mono [2-(meth) acryloyloxyethyl] phthalate and ω-carboxy polycaprolactone mono (meth) acrylate; and block isocyanate compounds.

From the viewpoint of improving the adhesiveness with the cured films such as the flattened film and the organic film, the adhesion accelerator, the surfactant having a polymerizable unsaturated group, a polyfunctional thiol, and the block isocyanate compounds are preferably contained.

Among the adhesion accelerators, silane compounds having an oxiranyl group such as 3-glycidoxypropyltrimethoxysilane, 3-glycidoxypropylmethyldimethoxysilane and 2-(3, 4-epoxycyclohexyl)ethyltrimethoxysilane; and silane compounds having an ethylenically unsaturated bond such as vinyl trimethoxysilane, vinyl triethoxysilane, vinyl tris (2-methoxyethoxy)silane and 3-methacryloyloxypropyltrimethoxysilane are preferable. A content of the adhesion accelerator is preferably from 1 to 30 parts by mass to 100 parts by mass of the binder resin.

As specific examples of the surfactant having a polymerizable unsaturated group, compounds described in paragraphs [0041] to [0055] of specification of JP4965083B1 may be used, and as examples of commercially available products, compounds described in paragraph [0032] of specification of JP5626063B1, and compounds described in paragraph [0057] of specification of JP5552364B1 may be used. A content of the surfactant having a polymerizable unsaturated group is preferably from 1 to 50 parts by mass to 100 parts by mass of the infrared-absorbing agent.

The polyfunctional thiol is a compound having two or more sulfanyl groups, and, for example, hydrocarbons having two or more sulfanyl groups as the substituent group, poly(mercaptoacetate) sorts of polyhydric alcohol, poly(3-mercaptopropionate) sorts of polyhydric alcohol, poly(2-mercaptopropionate) sorts of polyhydric alcohol, poly(3-mercaptobutyrate) sorts of polyhydric alcohol, heterocycles having two or more sulfanyl groups as the substituent group and polysiloxanes having two or more sulfanyl groups may be used. Specifically, compounds described in paragraphs [0073] to [0079] of JP2013-083932A1 may be used. A content of the polyfunctional thiol is preferably from 1 to 50 parts by mass to 100 parts by mass of the binder resin.

The block isocyanate compound may be obtained by reacting an isocyanate group with an active hydrogen group-containing compound (blocking agent) followed by inactivating at room temperature, and has a property that upon heating this, a blocking agent dissociates to regenerate an isocyanate group. As the commercially available products, isocyanate groups blocked with an oxime of methyl ethyl ketone including Duranate TPA-B80E, TPA-B80X, E402-B80T, MF-B60XN, MF-B60X and MF-B80M (manufactured by Asahi Kasei Corporation); isocyanate groups blocked with an active methylene including Duranate MF-K60X (manufactured by Asahi Kasei Corporation); and block bodies of isocyanate compounds having a (meth) acryloyl group including Karenz MOI-BP and Karenz MOI-BM (manufactured by Showa Denko KK) may be used. A content of the blocked isocyanate compound is preferably from 5 to 100 parts by mass relative to 100 parts by mass of the binder resin.

1-4-8. Manufacturing Method of Infrared Cut Filter Layer

The infrared cut filter layer 142 according to one embodiment of the present invention may be formed by using, for example, the infrared-absorbing composition described above and has high light blocking property in the infrared wavelength region (infrared blocking property) and also excellent adhesiveness with the cured film.

A method of forming the infrared cut filter layer 142 by using the infrared-absorbing composition will be described step by step. The infrared cut filter layer 142 according to an embodiment of the present invention may be formed by sequentially carrying out the following steps from (1) to (4) or by carrying out steps including step (1) and step (4) followed by carrying out a step (5).

(1) A step of forming a coated film by coating the infrared-absorbing composition of the present invention on a substrate, (2) a step of irradiating radiation on at least a part of the coated film, (3) a step of developing the coated film (developing step), (4) a step of heating the coated film (heating step), and (5) a step of removing a part of an infrared cut filter layer obtained in the step (4).

1-4-8-1. Step (1)

First, the infrared-absorbing composition is coated on a substrate and the solvent is removed by, preferably, heating (prebaking) a coated surface to form a coated film. The substrate here is a concept including a color filter layer and a cured film, and a light-receiving surface of a photodiode and may be appropriately changed in accordance with an embodiment.

A coating method of the infrared-absorbing composition is not particularly restricted, and, an appropriate method such as a spray method, a roll coat method, a rotation coating method (spin coat method), a slit-die coating method or a bar coat method may be used. Particularly, the spin coat method is preferable.

In the prebake performed as needs arise, a well-known heating means such as an oven, a hot plate, or an IR heater may be used, and drying under reduced pressure and drying under heating may be combined. The heating condition may be set at, though different depending on kinds and compounding ratios of the respective components, for example, a temperature of from 60 to 200° C. and a time for about from 30 seconds to 15 minutes.

1-4-8-2. Step (2)

The step (2) is a step of irradiating radiation on a part or an entirety of the coated film formed in the step (1). In this case, in the case of exposing a part of the coated film, the exposure is performed via, for example, a photomask having a predetermine pattern. As was described above, the infrared cut filter according to a first embodiment has an opening part on a region where the photodiode 136*d* is provided. When the infrared cut filter is formed using the infrared-absorbing composition imparted with the alkali developability, a pattern of the photomask may be made to correspond to a pattern of the photodiode 136*d*.

Radiations to be used to expose include an electron beam, and UV or visible light such as KrF, ArF, g-line, h-line or i-line, and among these, KrF, g-line, h-line and i-line are preferable. As an exposure method, a stepper-exposure method and an exposure method due to a high-pressure mercury lamp may be used. An exposure amount is preferably from 5 to 3000 mJ/cm$^2$, more preferably from 10 to 2000 mJ/cm$^2$, and still more preferably from 50 to 1000 mJ/cm$^2$. Although an exposure device may be appropriately selected from well-known devices without particular restriction, for example, a UV-exposure machine such as a super high-pressure mercury lamp may be used.

1-4-8-3. Step (3)

The step (3) is a step where the coated film obtained in the step (2) is developed with an alkali developer to dissolve and remove an unnecessary part (A part irradiated by radiation in the case of a positive type. A part that is not irradiated by radiation in the case of a negative type.).

Preferable examples of the alkali developers include aqueous solutions of sodium carbonate, sodium hydrogen carbonate, sodium hydroxide, potassium hydroxide, tetramethyl ammonium hydroxide, choline, 1,8-diazabicyclo-[5.4.0]-7-undecene, 1,5-diazabicyclo-[4.3.0]-5-nonene and the like.

To the alkali developers, an appropriate amount of an aqueous organic solvent such as methanol or ethanol or a surfactant may be also added. The alkali development is usually followed by washing with water.

As a development treatment method, a shower development method, a spray development method, a dip (immersion) development method, a puddle (liquid swelling) development method or the like may be used. The development is preferably performed under the condition of room temperature and 5 to 300 seconds.

1-4-8-4. Step (4)

In the step (4), a heating device such as a hot plate, an oven or the like is used to heat a patterned coated film obtained by the steps (1) to (3), or a coated film that is obtained by the step (1) and the step (2) that is performed as needs arise and is not patterned, at a relatively high temperature to form an infrared cut filter layer of the present invention. Thus, the mechanical strength and crack resistance of the infrared cut filter layer may be enhanced.

A heating temperature in the present step is, for example, from 120° C. to 250° C. A heating time may be set at, though different depending on the kind of the heating device, from 1 to 30 minutes when the heating step is performed on the hot plate, or from 5 to 90 minutes when the heating step is performed in the oven. Further, a step bake method where the heating step is applied two or more times or the like may be also used.

1-4-8-5. Step (5)

The step (5) is a step for partially removing the infrared cut filter layer obtained in the step (4). For example, in the case where the infrared-absorbing composition that does not have the alkali developability is applied over an entire surface of the substrate in the step (1), after the step (4), an infrared cut filter layer that does not have an opening is formed. Thus, by the step (5), an opening may be provided on a part corresponding to the infrared pass filter layer 140. Specifically, a photoresist layer is formed on the infrared cut filter layer obtained in the step including the step (1) and the step (4), the photoresist layer is pattern-wisely removed to form a resist pattern, followed by etching by dry etching with the resist pattern as an etching mask, and the resist pattern remaining after the etching is removed. Thus, a part of the infrared cut filter layer may be removed. Regarding a more specific method, for example, JP2008-241744A1 may be referenced.

The infrared cut filter layer 142 formed in this manner is provided at a thickness of 15 μm or thinner, preferably from 0.1 to 15 μm, more preferably from 0.2 to 3 μm, still more preferably from 0.3 to 2 μm, and particularly preferably from 0.5 to 1.5 μm. When the infrared cut filter layer 142 is set at a film thickness like this, a thickness of the optical filter layer 132 may be thinned. Further, by making the infrared cut filter layer 142 thinner, a film thickness of a second cured film 144b provided on an upper layer may be also thinned. That is, when the second cured film 144b is used as a flattened film, a height of a step due to the infrared cut filter layer 142 is lowered, and, by this amount, the film thickness of the second cured film 144b may be thinned. Thus, by reducing the film thickness of the infrared cut filter layer 142, an entire thickness of the optical filter layer 132 may be thinned, as a result, the solid-state imaging device may be thinned.

The infrared cut filter layer 142 has, when formed with the infrared-absorbing composition as described above, an absorption maximum in the range of wavelength of from 600 to 2000 nm and preferably from 700 to 1000 nm, and has a function of blocking light in the wavelength range.

In the solid-state imaging device according to the present embodiment, by providing the infrared cut filter layer 142 having optical characteristics like this by overlapping on the color filter layers 138a to 138c, in the photodiodes 136a to 136c, visible lights of particular wavelength bands corresponding to the respective color filter layers 138a to 138c, from which light in the infrared wavelength region is cut are input. Therefore, the first pixels 122a to 122c are capable of accurately detecting the visible light without being influenced by noise due to the infrared light. In this case, by thinning the infrared cut filter layer 142, the solid-state imaging device may be thinned.

1-5. Cured Film

The cured film 144 is provided between the color filter layers 138a to 138c and the micro-lens array 134. The cured film 144 is preferred to have light transmittance in both of the visible light wavelength region and the infrared wavelength region. Although of the light input via the micro-lens array 134, lights of particular wavelength bands are input on the photodiodes 136a to 136c by the infrared cut filter layer 142, the infrared pass filter layer 140 ad the color filter layer 138, it is preferred that in a region other than the various kinds of filter layers in a path of incident light, the light is not attenuated as far as possible.

Further, the cured film 144 preferably has insulating properties such that a parasite capacitance may not be generated between the cured film and, for example, the wiring layer 130. Since the cured film 144 is provided on a substantial front face of the optical filter layer 132, if the cured film 144 has conductivity, unintentional parasite capacitance is formed in between the cured film and the wiring layer 130. Since when the parasite capacitance is generated, detection operations of the photodiodes 136a to 136c are disturbed, the cured film 144 preferably has insulating properties.

Further, the cured film 144 desirably has excellent adhesiveness with a layer in contact therewith. For example, when the adhesiveness between the cured film 144 and the infrared cut filter layer 142 is poor, peeling occurs, and the optical filter layer 132 is damaged.

Further, since in the cured film 144, the infrared cut filter layer 142, the infrared pass filter layer 140 and the color filter layer 138 are buried and on these layers the micro-lens array 134 is provided, it is preferable that a surface is flattened. That is, the cured film 144 is preferably used as a flattened film.

To characteristics required thus, as the cured film 144, an organic film is preferably used from the viewpoint of obtaining a cured film having transmittance and insulating properties. The organic film is further preferable to be a flattened film obtained by using a flattened film-forming curable composition. That is, by a leveling action after the flattened film-forming curable composition is applied, even when an underlying surface contains irregularity, a flattened film (cured film) having a flat surface may be obtained.

As a composition for preparing the cured film 144, a curable composition containing a curable compound and a solvent, particularly, a flattened film-forming curable composition containing a curable compound and a solvent is preferable. As the solvent in the curable composition, the same as those described as the solvent in the infrared-absorbing composition may be used, and a preferable aspect is also the same as described above.

In what follows, curable compounds that constitute the curable composition will be described.

1-5-1. Curable Compounds

As the curable compound that constitutes the curable composition, as far as it is compound that is cured by light or heat, for example, a resin having an oxygen-containing saturated heterocyclic group, a resin having a polymerizable saturated group in a side chain, polysiloxane, a polyimide resin, a polyamide resin, a polymerizable compound and the like may be used.

As the oxygen-containing saturated heterocyclic group in the resins having the oxygen-containing saturated heterocyclic group, the same as those described above may be used, and among these, an oxiranyl group and an oxetanyl group are preferable, and the oxiranyl group is more preferable.

As the resins having the oxygen-containing saturated heterocyclic group, an acrylic resin having the oxygen-containing saturated heterocyclic group is preferable, specifically, a (co)polymer of (meth)acrylic acid ester having the oxygen-containing saturated heterocyclic group may be used. As the (meth)acrylic acid ester having the oxygen-containing saturated heterocyclic group, other than the same as described above, compounds described in paragraph [0014] of JPH06-157716A1 and compounds described in paragraph [0014] of JP2000-344866A1 may be used. Among these, glycidyl (meth)acrylate is preferable.

The (co)polymer of the (meth)acrylic acid ester having the oxygen-containing saturated heterocyclic group is preferably a copolymer with another copolymerizable ethylenically unsaturated monomer. As other copolymerizable ethylenically unsaturated monomer like this, the unsaturated monomer (1) described above, and the unsaturated monomer (2) described above (However, a (meth) acrylic acid ester having the oxygen-containing saturated heterocyclic group is removed.) may be used. Among the unsaturated monomers (1), (meth)acrylic acid, maleic acid and maleic anhydride are preferable. Among the unsaturated monomers (2), an aromatic vinyl compound and a (meth)acrylic acid ester having an alicyclic hydrocarbon group are preferred.

A preferable copolymerization ratio in the (co)polymer of the (meth)acrylic acid ester having the oxygen-containing saturated heterocyclic group is as shown below. The copolymerization ratio of the (meth)acrylic acid ester having the oxygen-containing saturated heterocyclic group is from 10 to 90% by mass, further from 15 to 80% by mass, preferably from 20 to 70% by mass. The copolymerization ratio of the unsaturated monomer (1) is from 5 to 40% by mass and preferably from 10 to 30% by mass. The copolymerization ratio of the unsaturated monomer (2) (However, the (meth) acrylic acid ester having the oxygen-containing saturated heterocyclic group is removed.) is from 5 to 85% by mass, and preferably from 10 to 70% by mass.

Specific examples of the acrylic resins having the oxygen-containing saturated heterocyclic group include copolymers described in JPH06-157716A1, JPH06-192389A1, JPH09-100338A1 and JP2000-344866A1.

As the polymerizable unsaturated group in the resin having a polymerizable unsaturated group in a side chain, a (meth)acryloyl group, a vinyl aryl group, a vinyloxy group, an ally group or the like may be used. Among these, the (meth)acryloyl group is preferable.

As a specific example of the resin having a polymerizable unsaturated group in a side chain, other than the b) illustrated as specific examples of the carboxyl group-containing polymers having the polymerizable unsaturated group in a side chain, polymers of the following e) to f) may be used, specifically, the acrylic resins described in JPH05-19467A1, JPH06-230212A1, JPH07-207211A1, JPH09-325494A1, JPH11-140144A1, JP2008-181095A1 and the like may be used.

(e) A (co)polymer obtained by reacting an unsaturated isocyanate compound with a (co)polymer of a monomer formed by containing a polymerizable unsaturated compound having a hydroxyl group, and (f) a (co)polymer obtained by reacting the unsaturated monomer (1) with a (co)polymer of a monomer formed by containing the polymerizable unsaturated compound having an oxiranyl group.

Other than the above, as the acrylic resin having the polymerizable unsaturated group in a side chain, acrylic resins having a structural unit represented by the formula (1) or (2) of JP5586828B1 may be also used.

Further, as the resin having the polymerizable unsaturated group in a side chain, an epoxy acrylate resin obtained by reacting the unsaturated monomer (1) with an epoxy resin may be also used. The epoxy acrylate resin may be produced according to a well-known method.

As the polysiloxane, the same as those described in the infrared-absorbing composition may be used. Among these, polysiloxane containing at least one kind of substituent group selected from the group consisting of the oxiranyl group, the (meth)acryloyl group and the sulfanyl group is preferable, and a hydrolysis condensate of a hydrolysable silane compound having at least one kind of substituent group selected from the group consisting of the oxiranyl group, the (meth)acryloyl group and the sulfanyl group is preferable. As the hydrolysable silane compound like this, the same as those described above may be used.

As the polyimide resin, the polyamide resin and the polymerizable compound, the same as those described in the infrared-absorbing composition may be used.

Among the polymerizable compounds constituting the curable composition like this, from the viewpoint of forming a cured film excellent in the adhesiveness with the infrared cut filter layer, the resins having the oxygen-containing saturated heterocyclic group, the resins having the polymerizable unsaturated group in a side chain, the polysiloxane, the polyimide resin and the polyamide resin are preferable, and the resins having the oxygen-containing saturated heterocyclic group, the resins having the polymerizable unsaturated group in a side chain and the polysiloxane are more preferable.

1-5-2. Photosensitizing Agent

In the curable composition, a photosensitizing agent may be further contained. As the photosensitizing agent, the same as those described above may be used, and the specific compounds and aspect are the same as those described above.

1-5-3. Additive

In the curable composition, an additive may be further contained. As the additive, the same as those described above may be used. Among these, an adhesiveness accelerator and the block cyanate compound are preferable.

Among the flattened film-forming curable compositions described above, from the viewpoint of forming the cured film having excellent adhesiveness with the infrared cut filter layer, any one of the followings is preferable.

(2-I) A curable composition containing a resin having the oxygen-containing saturated heterocyclic group and a solvent, (2-II) a curable composition containing a resin having the polymerizable unsaturated group in a side chain and a solvent, and (2-III) a curable composition containing polysiloxane and a solvent.

A preferable aspect in each of these (2-1) to (2-111) is as described above.

1-5-4. Manufacturing Method of Cured Film

The cured film according to the solid-state imaging device of the present invention may be formed by using, for example, the curable composition described above.

The cured film of the present invention may be formed by a process including the steps (1) and (4) described above except that a curable composition is used in place of the infrared-absorbing composition in the step (1) described above. Further, as needs arise, the steps (2) and (3) may be applied. The details and preferable aspects of these steps are the same as the step (1) to (4) described above.

As was described above, since the infrared cut filter layer 142 according to the solid-state imaging device of the present invention may sufficiently absorb infrared light, a film thickness of the infrared cut filter layer 142 may be made thinner. Therefore, since, for example, in the case of forming the second cured film 144b in the first embodiment, a step part between a top surface of the first cured film 144a and a top surface of the infrared cut filter layer 142 may be made smaller, there is an advantage that the second cured film may be readily formed. In other words, when a flattened film that is the second cured film is formed by a spin coat method, since the smaller the step part is, the easier the coating is, the second cured film 144b having a thin film thickness may be formed, resultantly, the solid-state imaging device may be thinned.

Further, when the infrared cut filter layer 142 and the cured film 144 are individually thinned, the adhesiveness in a lamination interface thereof may deteriorate to result in a fear of peeling. However, in a point that by rendering the infrared-absorbing composition or the curable composition in the present invention as described above, even when the infrared cut filter layer 142 or the cured film 144 is a thin film, the adhesiveness in the lamination interface may be made excellent, resultantly, the solid-state imaging device may be thinned, the solid-state imaging device of the present invention is preferably produced.

The solid-state imaging device 100 according to the present embodiment may be provided with, in addition to the above constitution, a dual band pass filter on the micro-lens array 134. That is, on a top surface of the infrared cut filter layer 142 and the infrared pass filter layer 140, a dual band pass filter having average transmittance of 75% or higher in the range of wavelength of from 430 to 580 nm, average transmittance of 15% or smaller in the range of wavelength of from 720 to 750 nm, average transmittance of 60% or higher in the range of wavelength of from 810 to 820 nm, and average transmittance of 15% or smaller in the range of wavelength of from 900 to 2000 nm may be provided. By adding the dual band pass filter, filtering performance in the visible light wavelength region and the infrared wavelength region may be further enhanced.

1-6. Operation of Solid-State Imaging Device

In the solid-state imaging device 100 shown in FIG. 2, of light input via the micro-lens array 134, infrared light is cut by the infrared cut filter layer 142 in the visible light detection pixel 118, and visible light is incident on the color filter layers 138a to 138c. On the other hand, in the infrared light detection pixel 120, the light input via the micro-lens array 134 is incident as it is on the infrared pass filter layer 140.

In the first pixels 122a to 122c, of light in the visible light wavelength region incident on the color filter layers 138a to 138c, visible lights transmitted in accordance with the respective optical characteristics are incident on the photodiodes 136a to 136c. Thus, the visible light may be detected with high accuracy without being influenced by the noise due to the infrared light. In the second pixel 124, light in the visible light wavelength region is cut by the infrared pass filter layer 140, and light in the infrared wavelength region (particularly, near-infrared wavelength region) is incident on the photodiode 136d. Thus, the infrared light may be detected with high accuracy without being influenced by the noise due to the visible light.

In the solid-state imaging device according to the present embodiment, by integrally providing the visible light detection pixel and the infrared light detection pixel, the solid-state imaging device capable of ranging by a TOF method may be realized. That is, the visible light detection pixel captures image data of a subject and the infrared light detection pixel may measure a distance to the subject. Thus, three-dimensional image data may be acquired. In this case, since in the visible light detection pixel, light in the infrared wavelength region is cut, imaging is performed with high sensitivity with less noise. In the infrared light detection pixel, light in the visible light wavelength region is blocked, and the ranging may be performed with high accuracy.

Further, in the solid-state imaging device according to the present embodiment, by making the infrared cut filter layer 142 thinner, resultantly by making the optical filter layer 131 thinner, the solid-state imaging device may be thinned. Thus, a chassis of a portable information device such as a smartphone and a tablet terminal may be thinned.

1-7. Example of Modification

Figure 3:
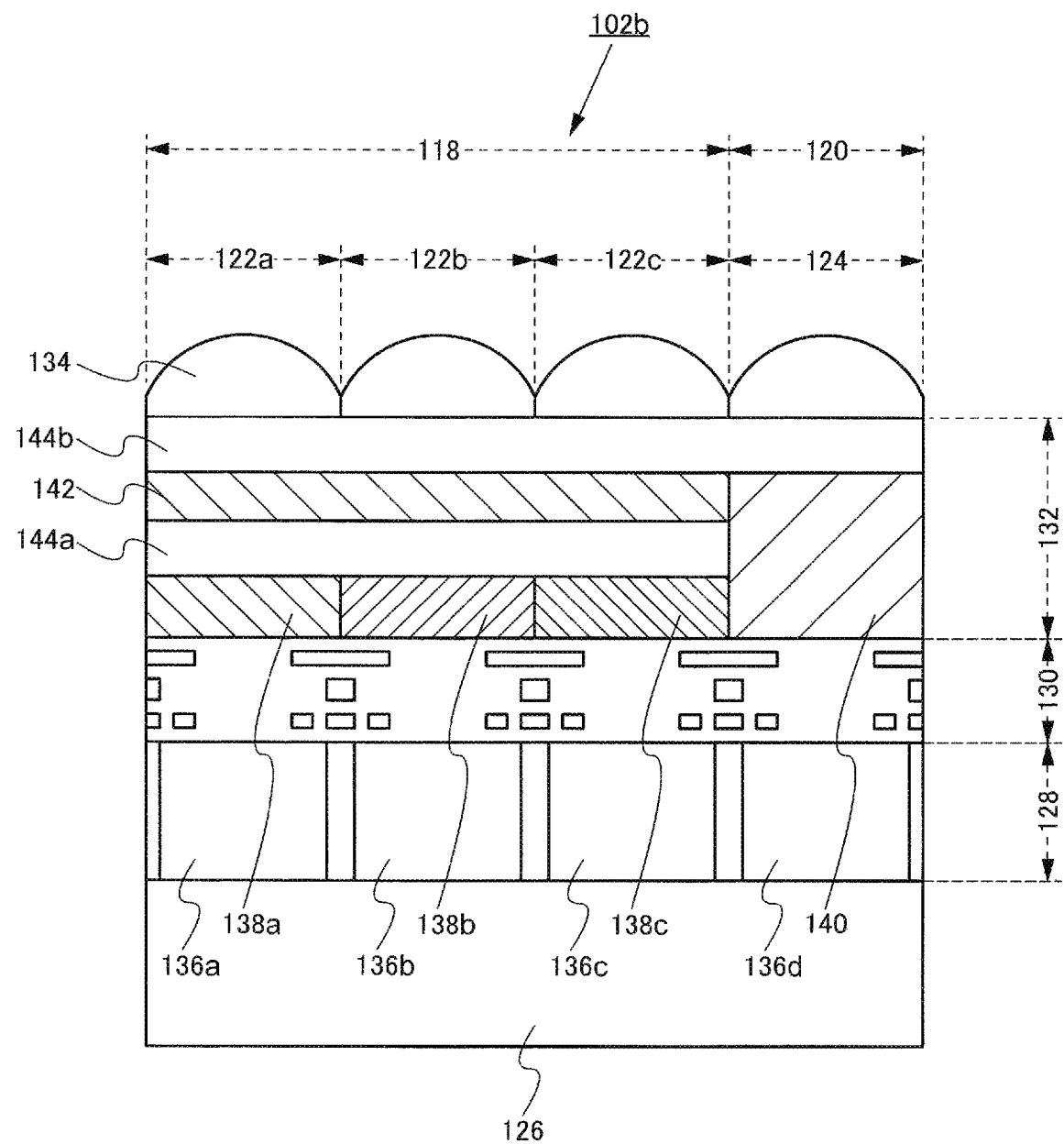
FIG. 3 is a cross-sectional diagram showing a configuration of a pixel part of the solid-state imaging device according to one embodiment of the present invention.

FIG. 3 shows one example of a pixel part 102b of the solid-state imaging device in which a thickness of the infrared pass filter layer 140 is varied. The pixel part 102b shown in FIG. 3 has a height of a top surface of the infrared pass filter 140 which is substantially coinciding with a height of a top surface of the infrared cut filter layer 142. More specifically, a height difference between the top surface of the infrared pass filter layer 140 and the top surface of the infrared cut filter layer 142 is preferably within 0.3 μm, more preferably within 0.2 μm, and still more preferably within 0.1 μm. In other words, the film thickness of the infrared pass filter layer 140 has a substantially same value as a total value of the film thickness of the infrared cut filter layer 142, the film thickness of the first cured film 144a, and the film thickness of the color filter layer 138a, the color filter layer 138b or the color filter layer 138c juxtaposed on a top surface of the first cured film 144a.

Thus, by increasing the thickness of the infrared pass filter layer 140, it is possible to make sufficiently absorb the visible light and to make the visible light not enter on the photodiode 136d. Thus, the infrared light may be detected with high accuracy and with high sensitivity. In this case, since the second pixel 124 is not provided with the infrared cut filter layer 142, even when the film thickness of the infrared pass filter layer 140 is increased, the thickness of the optical filter layer 132 is not influenced.

Further, by making the height of the top surface of the infrared pass filter layer 140 substantially equal with the height of the top surface of the infrared cut filter layer 142, the flatness of the underlying surface of the second cured film 144b may be improved. Though the second cured film 144a itself may have a function as the flattened film, when forming the second cured film 144b by coating the curable composition, the closer to a flat surface the underlying surface is, the less the coating irregularity of the curable composition, and, the flatness of the top surface of the second cured film 144b may be improved. Thus, the micro-lens array 134 that is formed on the top surface of the second cured film 144b may be formed with high accuracy, and the solid-state imaging device may obtain an image having less distortion. As the curable composition in this case, the composition selected from the (2-I) to (2-III) is preferable.

Now, since the pixel part 102b shown in FIG. 3 has the same configuration as that of the pixel part 102a shown in FIG. 2 except that the film thickness of the infrared pass filter layer 140 is varied, the similar action effect may be obtained in the solid-state imaging device.

Second Embodiment

Figure 4:
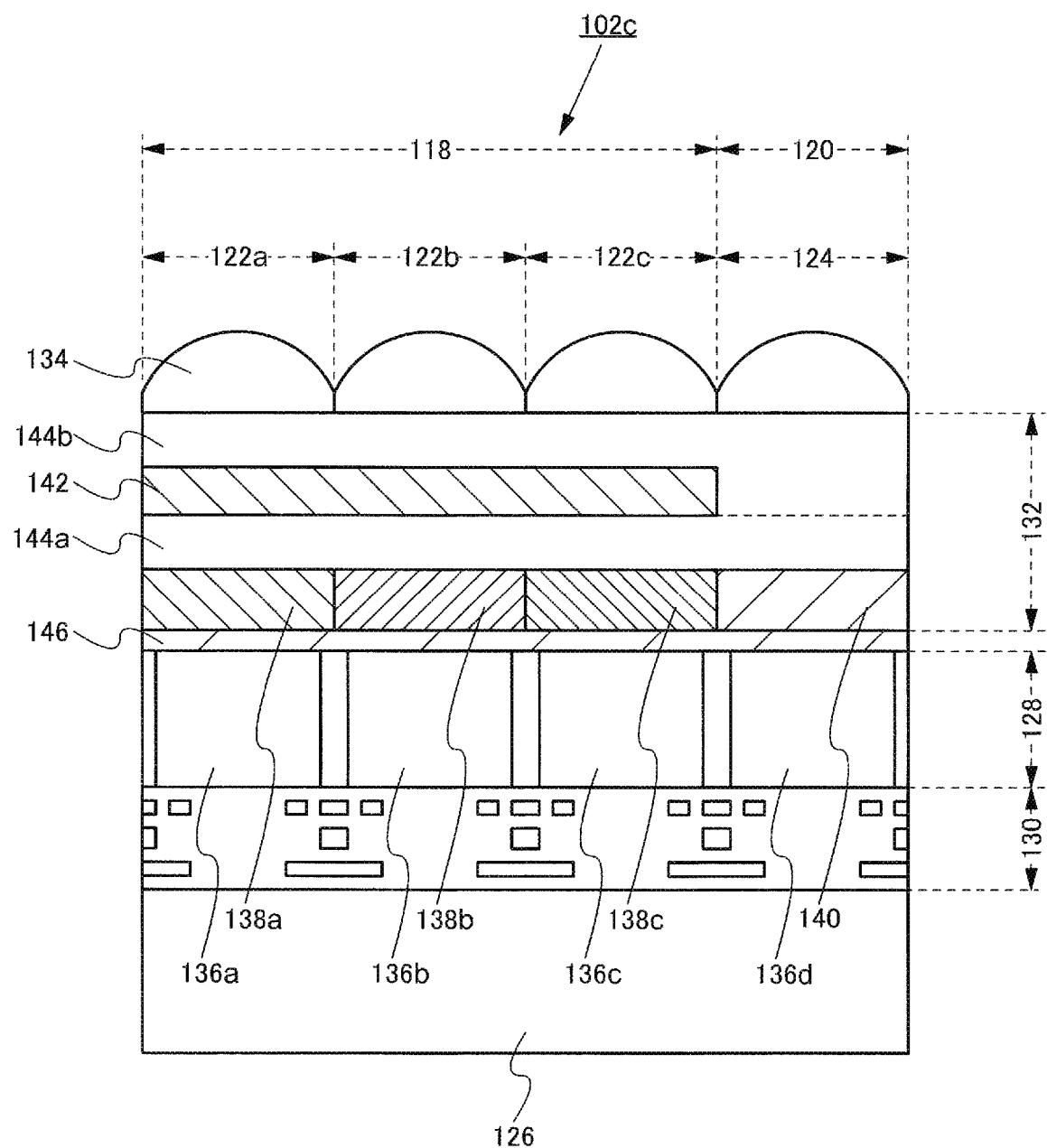
FIG. 4 is a cross-sectional diagram showing a configuration of a pixel part of the solid-state imaging device according to one embodiment of the present invention.

FIG. 4 shows a cross-sectional structure of the pixel part 102c of the solid-state imaging device according to the present embodiment. The pixel part 102c includes the visible light detection pixel 118 and the infrared light detection pixel 120 and is the same as the first embodiment in the point that the layer structure includes the semiconductor layer 128, the wiring layer 130, the optical filter layer 132, and the micro-lens array 134. However, the pixel part 102c of the solid-state imaging device according to the present embodiment has a configuration of backside illumination type in which the wiring layer 130 is provided on a lower surface side of the photodiodes 136a to 136d. A pixel part of the backside illumination type is thinned so as to expose the photodiodes 136a to 136d by grinding and polishing a back surface of the relevant semiconductor substrate after forming the photodiodes 136a to 136d on the semiconductor substrate followed by forming the wiring layer 130 thereon. In this case, the substrate 126 is adhered to the semiconductor layer 128 as a supporting base material.

Since the pixel part 102c of the backside illumination type is devoid of the wiring layer 130 on the light-receiving surface of the photodiodes 136a to 136d, there is an advantage that a large opening rate is obtained, the loss of incident light is suppressed, and a brighter image may be output with the same light amount.

In the present embodiment, the configuration of the optical filter layer 132 and the micro-lens array 134 is the same as the first embodiment. An organic film 146 is provided between the photodiodes 136a to 136d and the color filter layers 138a to 138c and the infrared pass filter layer 140. The organic layer 146 covers a top surface of the photodiodes 136a to 136d and flattens an underlying surface of the color filter layer 138a to 138c and the infrared pass filter layer 140. Further, the organic layer combines a function as a protective film of the photodiodes 136a to 136d.

The organic film 146 is prepared by using the curable composition containing the curable compound and the solvent in the same manner as the composition for preparing the cured film 144. When these materials are used, the top surface of the photodiodes 136a to 136d is flattened, and the adhesiveness with the color filter layers 138a to 138c and the infrared pass filter layer 140 may be improved. Among these, the composition selected from the (2-I) to (2-III) is more preferable.

In FIG. 4, the height of the top surface of the infrared pass filter layer 140 may be formed so as to substantially coincide with the height of the top surface of the infrared cut filter layer 142 in the same manner as the pixel part 102b shown in FIG. 3. Thus, since the flatness of the underlying surface of the second cured film 144b may be improved, the flatness of the top surface of the second cured film 144b may be more improved. Thus, the micro-lens array 134 formed on the top surface of the second cured film 144b may be formed with high accuracy, and the solid-state imaging device may obtain an image having less distortion.

Also in the present embodiment, in the same manner as the first embodiment, in addition to the above configuration, the dual band pass filter may be provided on the micro-lens array 134.

According to the present embodiment, since the pixel part 102c is formed into the backside illumination type, the solid-state imaging device having high light utilization efficiency and high sensitivity may be provided. In addition, thereto, since the optical filter layer 132 has the same configuration as the first embodiment, the optical filter layer is thinned, and the solid-state imaging device may be thinned. That is, according to the present embodiment, while having the characteristics of the backside illumination type, the solid-state imaging device exhibiting the same action effect as the first embodiment may be provided.

Third Embodiment

Figure 5:
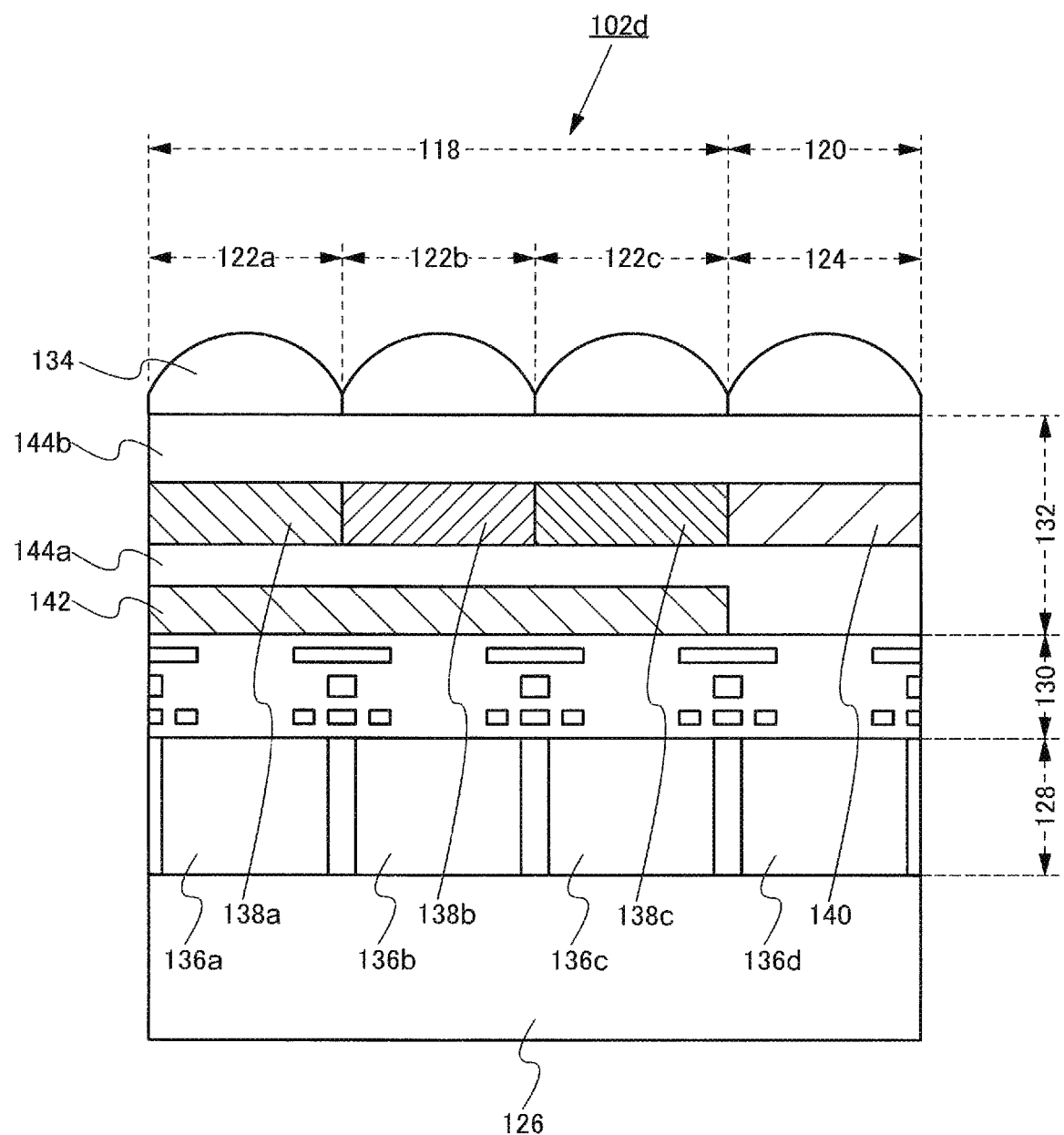
FIG. 5 is a cross-sectional diagram showing a configuration of a pixel part of the solid-state imaging device according to one embodiment of the present invention.

FIG. 5 shows a cross-sectional structure of the pixel part 102d of the solid-state imaging device according to the present embodiment. The pixel 102d is the same as the first embodiment in the point of including the visible light detection pixel 118 and infrared light detection pixel 120, and including the semiconductor layer 128, the wiring layer 130, the optical filter layer 132, and the micro-lens array 134 in the layer structure. However, the optical filter layer 132 is different from the configuration of the pixel part according to the first embodiment in the point that the infrared cut filter layer 142 is provided on a lower surface side of the color filter layers 138a to 138c.

The infrared cut filter layer 142 is the same as that shown in the first embodiment, and has a thickness of from 0.1 to 15 μm, preferably from 0.2 to 3 μm, more preferably from 0.3 to 2 μm, and particularly preferably from 0.5 to 1.5 μm. The first cured film 144a is provided between the infrared cut filter layer 142 and the color filter layers 138a to 138c. The first cured film 144a buries the infrared cut filter layer 142 and the top surface is flattened. That is, since the infrared cut filter layer 142 is provided in the first pixels 122a to 122c and is not provided in the second pixel 124, when the color filter layer is provided immediately thereon, a step part due to the infrared cut filter layer 142 is problematic. By flattening the step part by burying with the first cured film 144a, the color filter layer 138 may be homogeneously formed, and the optical characteristics may be made not to be influenced.

In this case, as the cured film, what is formed by using the same as the curable composition described above is preferable, among these, by using the composition selected from the (2-I) to (2-III) described above, the adhesiveness with the infrared cut filter layer 142 is enhanced, and the top surface of the first cured film 144a may be flattened.

Further, in the infrared cut filter layer 142, among the infrared-absorbing agents shown in the first embodiment, by using the metal dithiol-based compounds, copper compounds, tungsten compounds or metal borides, or by using liked infrared-absorbing agent, the heat resistance may be enhanced. Further, by using also at least one kind selected from the group of the polyimide resin and polysiloxane as the binder resin, the heat resistance may be enhanced. Thus, the infrared cut filter layer 142 may have heat resistance to a heating temperature during formation of the cured film 144 prepared after the formation of the infrared cut filter layer 142 or during formation of the color filter layer 138 and may maintain the optical characteristics of cutting the infrared light.

Since the infrared cut filter layer 142 is provided at a thickness of from 0.1 to 15 μm, preferably from 0.2 to 3 μm, more preferably from 0.3 to 2 μm, and particularly preferably from 0.5 to 1.5 μm, a film thickness of the first cured film 144a provided thereon may be also thinned. Thus, the infrared cut filter layer 142 and the color filter layers 138a to 138c may be provided in the vicinity with each other. Thus, an influence of color mixing generated between adjacent pixels may be reduced.

In the pixel part 102d, by providing the top surfaces of the color filter layers 138a to 138c and the top surface of the infrared pass filter layer 140 so as to have the substantially same height, the flatness of the underlying surface of the second cured film 144b may be improved. The second cured film 144b itself may have a function as the flattened film. However, in the case of forming the second cured film 144b by coating the curable composition, the more flatter the underlying surface is, the less the coating irregularity of the curable composition is, and the flatness of the top surface of the second cured film 144b may be improved. Thus, the micro-lens array 134 formed on the top surface of the second cured film 144b may be formed with high accuracy, and the solid-state imaging device may obtain an image with less distortion.

Further, as another aspect, while increasing the film thickness of the infrared pass filter layer 140, the thickness of the first cured film 144a on a lower surface side may be reduced, or, by removing the first cured film 144a on the lower layer side of the infrared pass filter layer 140, a height of the lower surface of the infrared pass filter layer 140 and a height of the lower surface of the infrared cut filter layer 142 may be substantially coincided. Thus, the infrared light may be detected with high accuracy and with sensitivity.

In the same manner as the first embodiment also in the present embodiment, in addition to the configuration described above, the dual band pass filter may be provided on the micro-lens array 134.

The configuration of the pixel part 102d in the present embodiment is the same as the first embodiment except that in the optical filter layer 132, an arrangement of the infrared cut filter layer 142 and the color filter layers 138a to 138c is exchanged. That is, according to the present embodiment, the solid-state imaging device showing, in addition to the characteristics described above, the same action effect as the first embodiment may be provided.

Fourth Embodiment

Figure 6:
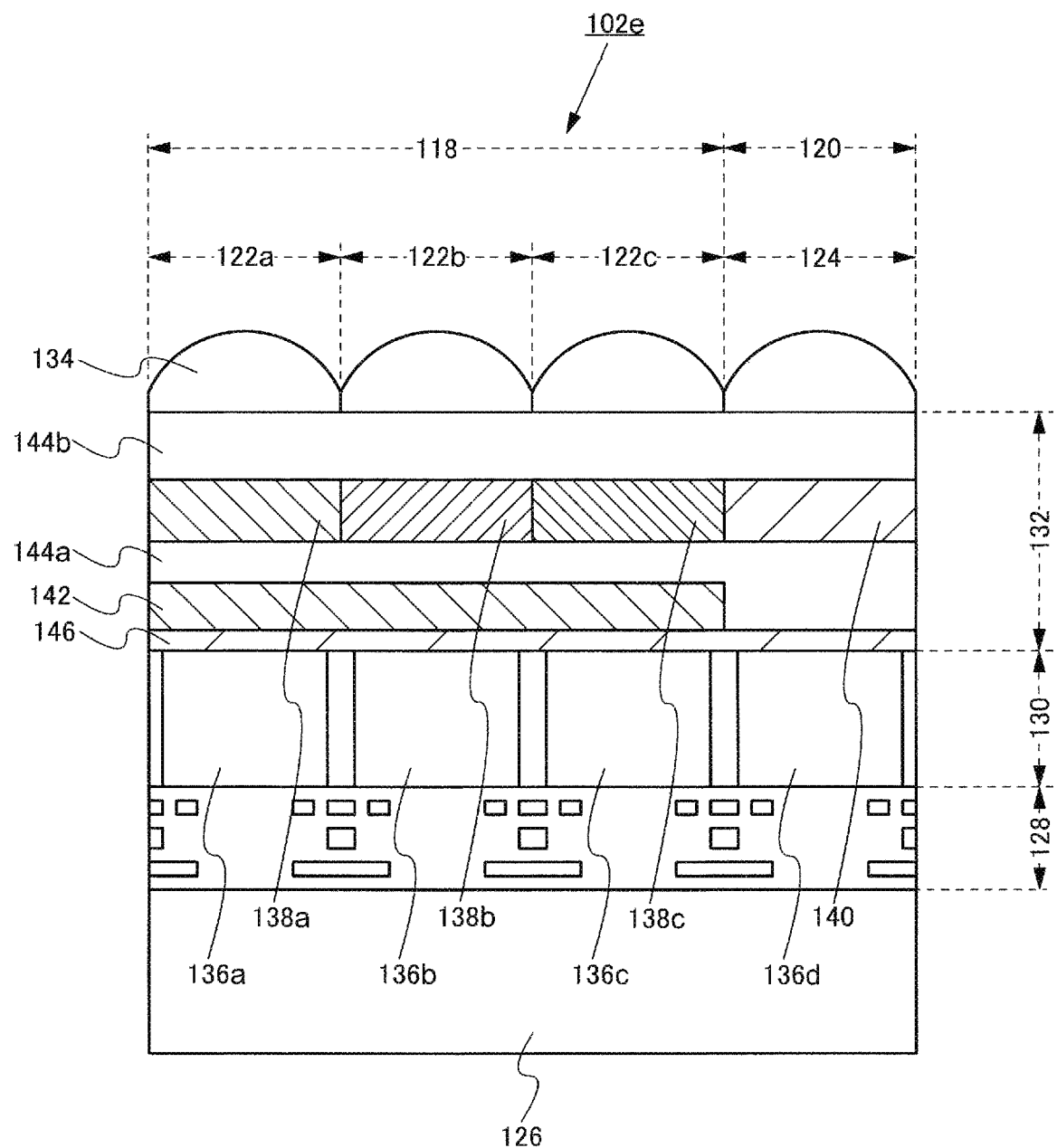
FIG. 6 is a cross-sectional diagram showing a configuration of a pixel part of the solid-state imaging device according to one embodiment of the present invention.

FIG. 6 shows a configuration of a pixel part 102e in the backside illumination type solid-state imaging device. The pixel part 102e has the same configuration as the third embodiment except having a backside illumination type configuration in which the wiring layer 130 is provided on a lower surface side of the photodiodes 136a to 136d. That is, the optical filter layer 132 has the infrared cut filter layer 142 provided on a lower surface of the color filter layers 138a to 138c.

The infrared cut filter layer 142 is provided on a top surface of the organic film 146. At this time, by forming the infrared cut filter layer 142 with the infrared-absorbing composition shown in the first embodiment, the adhesiveness with the organic film 146 may be enhanced. Thus, the optical filter layer 132 may be provided in an upper part of the organic film 146.

Also in the present embodiment, as described in the third embodiment, while increasing the film thickness of the infrared pass filter layer 140, the thickness of the first cured film 144a on a lower layer side may be decreased, or by removing the first cured film 144a on the lower layer side of the infrared pass filter layer 140, the height of a lower surface of the infrared pass filter layer 140 and the height of the lower surface of the infrared cut filter layer 142 may be substantially coincided. Thus, by increasing the thickness of the infrared pass filter layer 140 to make sufficiently absorb the visible light, the visible light may be prevented from entering the photodiode 136d. Thus, the infrared light may be detected with high accuracy and high sensitivity.

In the same manner as the embodiment 1 also in the present embodiment, in addition to the configuration described above, the dual band pass filter may be provided on the micro-lens array 134.

According to the present embodiment, in addition to the characteristics of the backside illumination type where imaging may be performed with high sensitivity, the same action effect as the third embodiment may be obtained.

Fifth Embodiment

Figure 7:
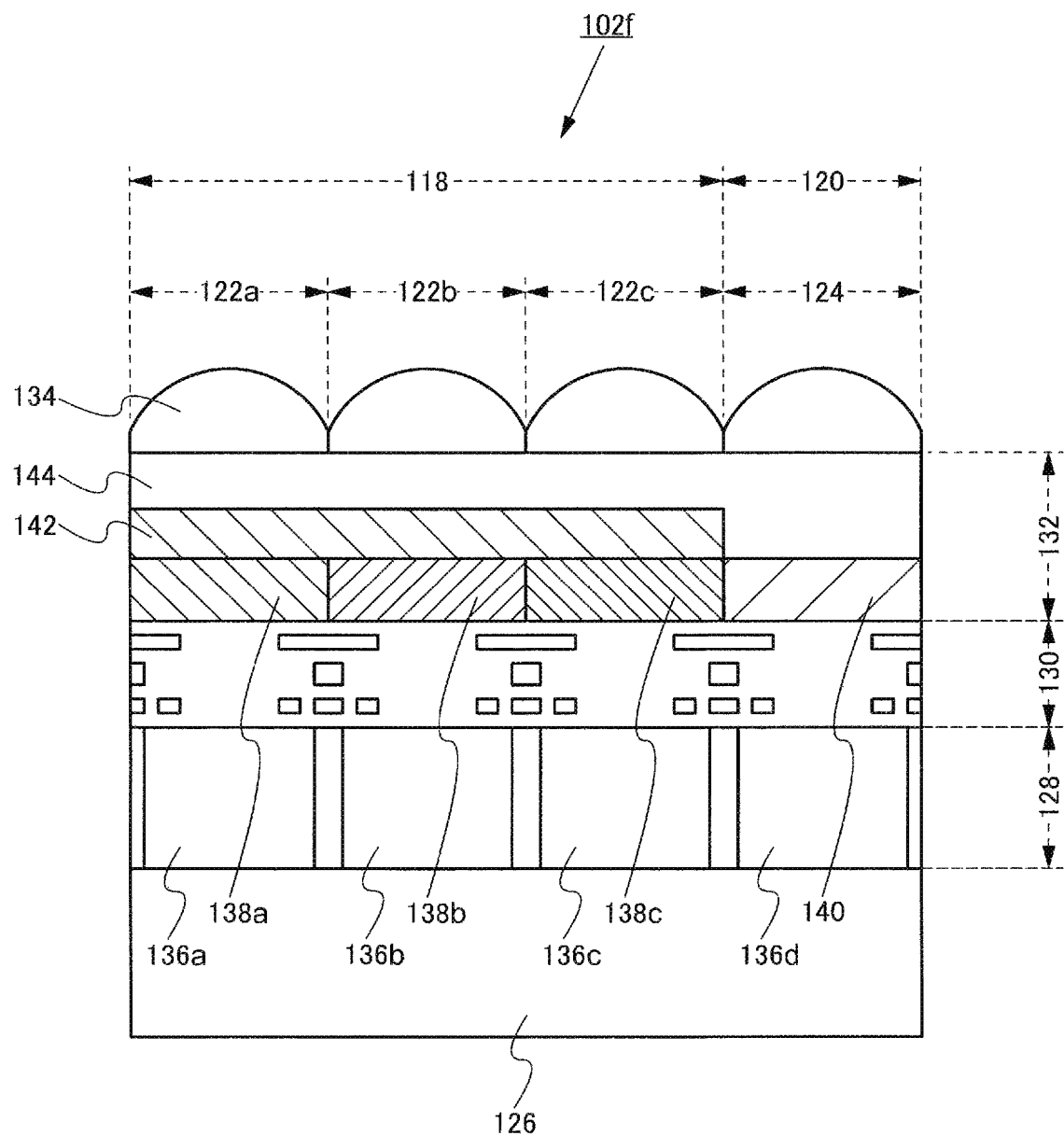
FIG. 7 is a cross-sectional diagram showing a configuration of a pixel part of the solid-state imaging device according to one embodiment of the present invention.

FIG. 7 shows a cross-sectional structure of a pixel part 102f of a solid-state imaging device according to the present embodiment. The pixel part 102f is the same as the first embodiment in the point of including the visible light detection pixel 118 and the infrared light detection pixel 120, and including the semiconductor layer 128, the wiring layer 130, the optical filter layer 132 and the micro-lens array 134 in the layer structure. However, the optical filter layer 132 is different from the configuration of the pixel part according to the first embodiment in the point that the infrared cut filter layer 142 is provided in contact with a top surface of the color filter layers 138a to 138c.

The infrared cut filter layer 142 is the same as that shown in the first embodiment and is provided at a thickness of from 0.1 to 15 μm. The infrared cut filter layer 142 and the color filter layers 138a to 138c do not have a cured film therebetween and are provided in contact with each other.

In the structure like this, when the infrared cut filter layer 142 is formed with the infrared-absorbing composition shown in the first embodiment, the adhesiveness with the cured film 144 provided in contact with the top surface thereof may be enhanced.

Further, since the infrared cut filter layer 142 is provided at a thickness of from 0.1 to 15 μm, preferably from 0.2 to 3 μm, more preferably from 0.3 to 2 μm, and particularly preferably from 0.5 to 1.5 μm, a film thickness of the cured film 144 provided thereon may be thinned. Thus, the infrared cut filter layer 142 and the micro-lens array 134 may be provided in the vicinity with each other. Further, by providing the infrared cut filter layer 142 and the color filter layer 138 in the vicinity with each other, an influence of color mixing generated between adjacent pixels may be reduced.

By making the infrared pass filter layer 140 thicker, the height of the top surface thereof may be made so as to substantially coincide with the height of the top surface of the infrared cut filter layer 142. By taking the configuration like this, the flatness of the underlying surface of the second cured film 144b may be improved. The second cured film 144b itself may have a function as the flattened film. However, the closer to a flat surface the underlying surface is, the more the flatness of the top surface of the second cured film 144b may be improved. Thus, the micro-lens array 134 formed on the top surface of the second cured film 144b may be formed with high accuracy, and the solid-state imaging device may obtain an image with less distortion.

Also in the present embodiment, in the same manner as the first embodiment, in addition to the above configuration, the dual band pass filter may be provided on the micro-lens array 134.

According to the present embodiment, in the optical filter layer 132, by providing the infrared cut filter layer 142 and the color filter layers 138a to 138c in contact with each other, in addition to the above characteristics, the layer structure of the optical filter layer 132 is omitted, and the solid-state imaging device may be thinned. Then, the configuration of the pixel part 102f is the same as that of the first embodiment except that the configuration of the optical filter layer 132 is different. That is, according to the present embodiment, the solid-state imaging device that shows, in addition to the characteristics described above, the same action effect as that of the first embodiment may be provided.

Sixth Embodiment

Figure 8:
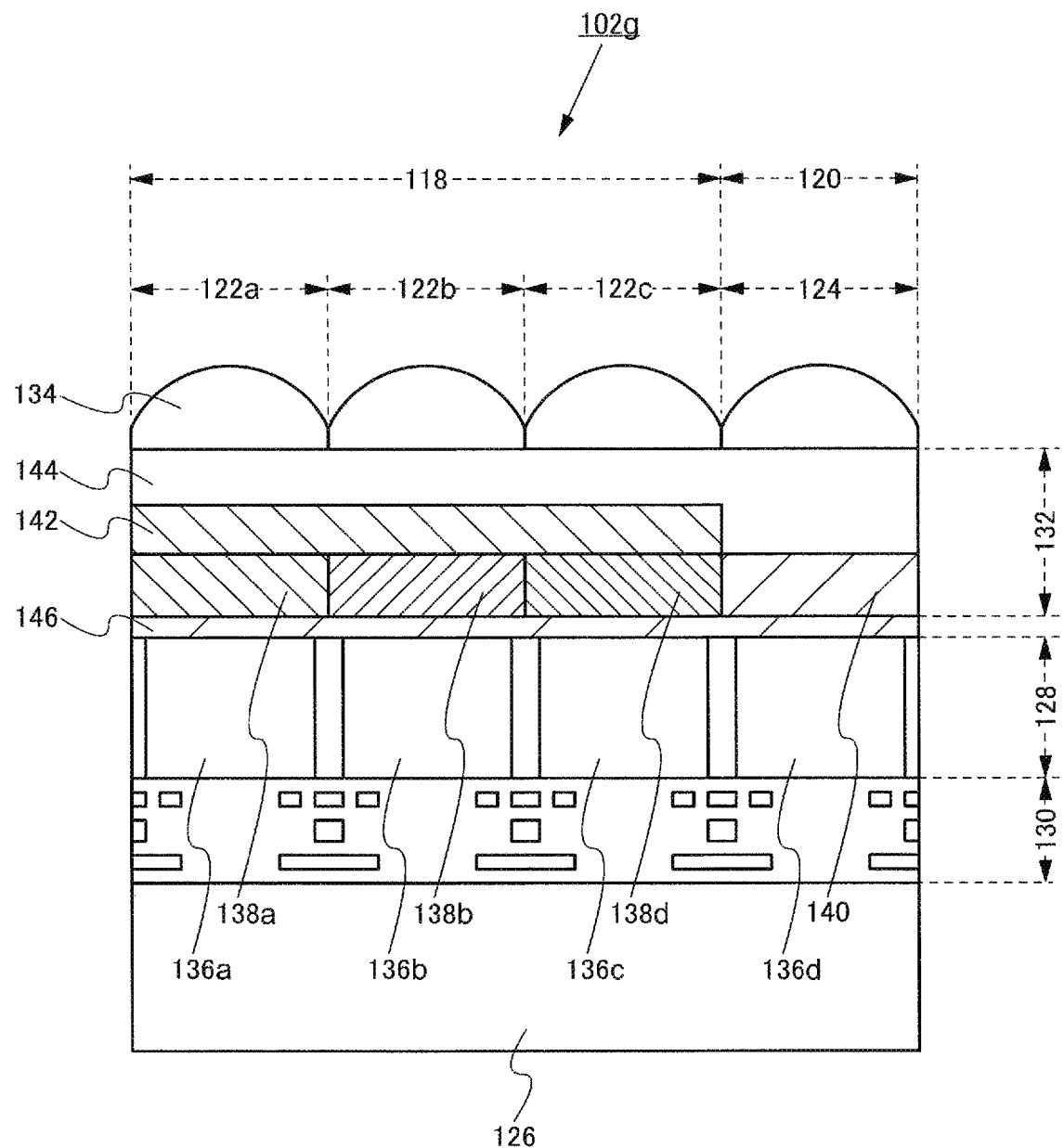
FIG. 8 is a cross-sectional diagram showing a configuration of a pixel part of the solid-state imaging device according to one embodiment of the present invention.

FIG. 8 shows a cross-sectional structure of a pixel part 102g of the solid-state imaging device according to the present embodiment. The pixel part 102g is the same as the pixel part 102f shown in the fifth embodiment except the point of having the backside illumination type configuration in which the wiring layer 130 is provided on a lower surface of the photodiodes 136a to 136d. The organic film 146 is provided between the photodiodes 136a to 136d and the color filter layers 138a to 138c and the infrared pass filter layer 140. The organic film 146 covers the top surface of the photodiodes 136a to 136d and flattens the underlying surface of the color filter layers 138a to 138c and the infrared pass filter layer 140. Further, the organic layer 146 combines a function as a protective film of the photodiodes 136a to 136d. The organic film 146 is the same as that shown in the second embodiment.

Also in the present embodiment, the height of the top surface of the infrared pass filter layer 140 may be formed so as to substantially coincide with the height of the infrared cut filter layer 142. Further, also in the present embodiment, in the same manner as the first embodiment, in addition to the configuration described above, the dual band pass filter may be provided on the micro-lens array 134.

According to the present embodiment, because the pixel part 102g shown in FIG. 8 has the backside illumination type, the utilization efficiency of light is enhanced, and the solid-state imaging device having high sensitivity may be provided. Since the other configuration is the same as the fifth embodiment, also in the solid-state imaging device according to the present embodiment, the similar action effect may be shown.

Seventh Embodiment

Figure 9:
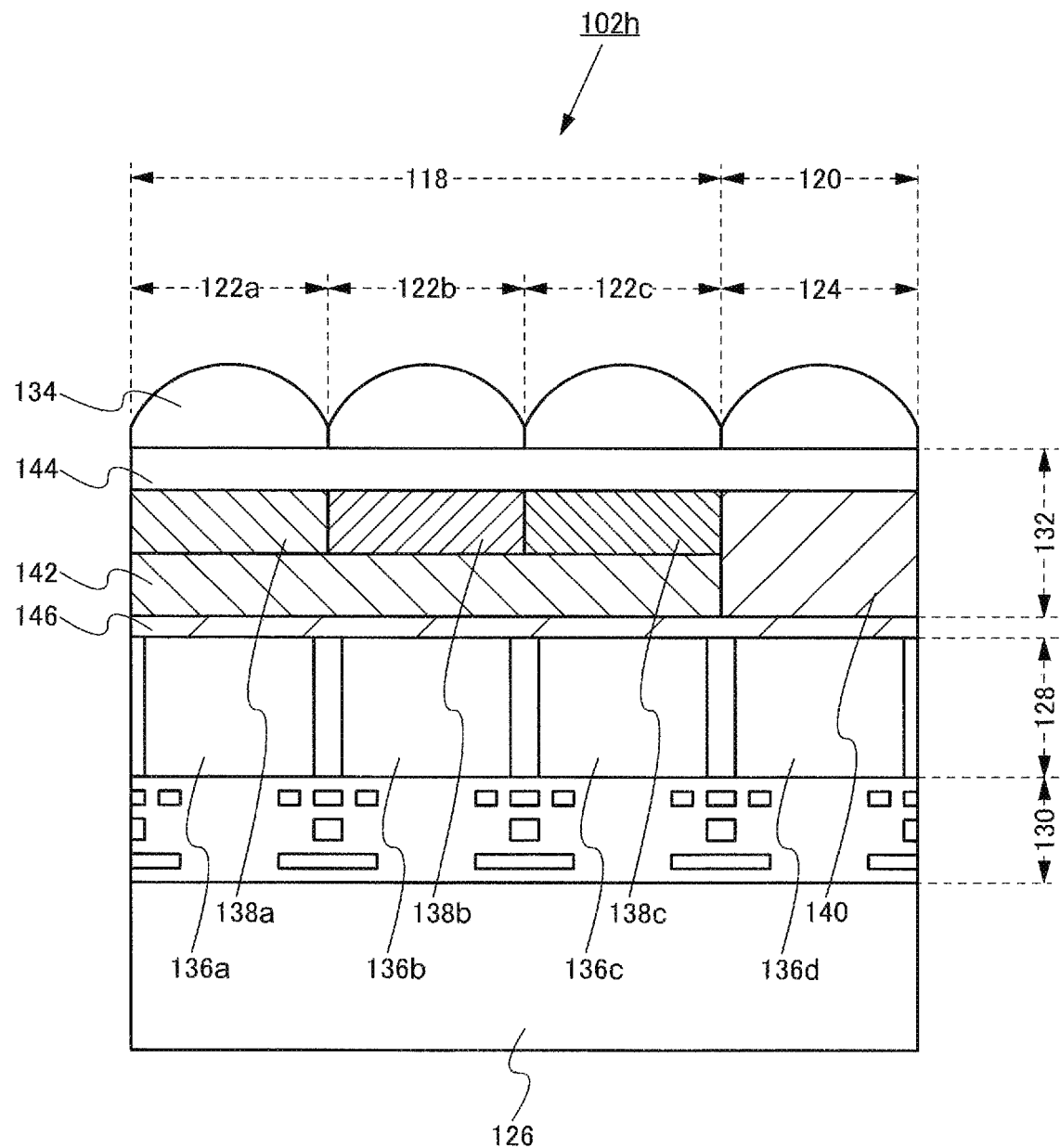
FIG. 9 is a cross-sectional diagram showing a configuration of a pixel part of the solid-state imaging device according to one embodiment of the present invention.

FIG. 9 shows a sectional structure of a pixel part 102h of the solid-state imaging device according to the present embodiment. The pixel part 102h is the same as the pixel part 102g shown in the sixth embodiment in the point of including the visible light detection pixel 118 and the infrared light detection pixel 120, including the semiconductor layer 128, the wiring layer 130, the optical filter layer 132, and the micro-lens array 134 in the layer structure, and having a configuration of the backside illumination type where the wiring layer 130 is provided on the lower surface of the photodiodes 136a to 136d. However, the optical filter layer 132 is different from the configuration of the pixel part according to the first embodiment in the point that the infrared cut filter layer 142 is provided in contact with a lower surface of the color filter layers 138a to 138c. The pixel part 102h is provided such that the height of the top surface of the infrared pass filter layer 140 may substantially coincide with the height of the top surface of the color filter layers 138a to 138c. That is, the height of the top surface of the infrared pass filter layer 140 is provided so as to substantially coincide with the height of the top surface of the infrared cut filter layer 142 and the color filter layers 138a to 138c laminated on the top surface thereof. More specifically, a height difference between the top surface of the infrared pass filter layer 140 and the top surface of the color filter layers 138a to 138c is preferably 0.3 μm or smaller, more preferably 0.2 μm or smaller and still more preferably 0.1 μm or smaller. In other words, the film thickness of the infrared pass filter layer 140 has a value substantially the same as a total value of the film thickness of the infrared cut filter layer 142, and the film thickness of the color filter layer 138a, the color filter layer 138b or the color filter layer 138c.

Thus, by increasing the thickness of the infrared pass filter layer 140, it is possible to make sufficiently absorb the visible light and to make the visible light not enter on the photodiode 136d. Thus, the infrared light is detected with high accuracy and high sensitivity.

By making substantially coincide the height of the top surface of the infrared pass filter layer 140 with the height of the top surface of the infrared cut filter layer 142, the flatness of the underlying surface of the second cured film 144b may be improved. Though the second cured film 144b itself may have the function as the flattened film, when the second cured film 144b is formed by coating the curable composition, the closer to a flat surface the underlying layer is, the less the coating irregularity of the curable composition is, and, the flatness of the top surface of the second cured film 144b may be improved. Thus, the micro-lens array 134 formed on the top surface of the second cured film 144b may be formed with high accuracy, and the solid-state imaging device may obtain an image with less distortion.

The pixel part 102h shown in FIG. 9 is provided with the infrared cut filter layer 142 on the top surface of the organic film 146. At this time, by forming the infrared cut filter layer 142 with the infrared-absorbing composition shown in the first embodiment, the adhesiveness with the organic film 146 may be enhanced. Thus, the optical filter layer 132 may be arranged in an upper part of the organic film 146.

Also in the present embodiment, in the same manner as the first embodiment, in addition to the above configuration, the dual band pass filter may be provided on the micro-lens array 134.

According to the present embodiment, in addition to the characteristics of the backside illumination type capable of obtaining high sensitivity imaging, the same action effect as the third embodiment may be obtained. Further, since the cured film 144 is provided only on the color filter layers 138a to 138c and the infrared pass filter layer 140, the optical filter layer 132 may be thinned.

EXAMPLES

In what follows, with reference to examples, the embodiments of the present invention will be described in more detail. However, the present invention is not limited to the following examples.

Example 1

The following respective compositions were used to form the infrared cut filter layer 142, the cured film 144 and the organic film 146.

In order to form the infrared cut filter layer 142, an infrared-absorbing composition (S-142-1) including 100 parts by mass of YMF-02A (manufactured by SUMITOMO METAL MINING CO., LTD.) as the infrared-absorbing agent, 11.73 parts by mass of a copolymer of benzyl methacrylate/styrene/N-phenylmaleimide/2-hydroxyethyl methacrylate/2-ethylhexyl methacrylate/methacrylic acid=14/10/12/15/29/20 (mass ratio) (acid value: 130 mg KOH/g, 33.9% by mass solution of propylene glycol monoethyl ether acetate) that is an acrylic resin as the binder resin, 3.98 parts by mass of dipentaerythritol hexaacrylate as the polymerizable compound, 0.53 parts by mass of NCI-930 (manufactured by ADEKA Corporation) as the polymerization initiator, 0.02 parts by mass of Futajiento FTX-218 (manufactured by NEOS COMPANY LIMITED) that is a fluorinated surfactant as the additive, and 68.75 parts by mass of propylene glycol monomethyl ether acetate as the solvent was used.

In order to form the cured film 144, a thermosetting resin composition (S-144-1) including 25 parts by mass of a copolymer of styrene/methacrylic acid/dicyclopentenyl methacrylate/glycidyl methacrylate=22.5/44.5/56.25/90 (mass ratio) that is an acrylic resin having an oxygen-containing saturated heterocyclic group and 75 parts by mass of diethylene glycol dimethyl ether as the solvent was used.

In order to form the organic film 146, a composition (S-146-1) including 10 parts by mass of a copolymer of t-butyl methacrylate/glycidyl methacrylate=37.5/62.5 (mass ratio) that is an acrylic resin having an oxygen-containing saturated heterocyclic group, 0.3 parts by mass of trimellitic acid as the additive, 0.5 parts by mass of 3-glycidoxypropyltrimethoxysilane, 0.005 parts by mass of product name "FC-4432" (manufactured by Sumitomo 3M Limited), and 55.2 parts by mass of methyl-3-methoxypropionate and 3.4 parts by mass of propylene glycol monoethyl ether as the solvent was used.

A substrate for evaluation, which schematically reproduces the optical filter layer 132 according to the fourth embodiment was prepared according to the following procedure.

First, on each of two 6-inch silicon wafers, by using an automatic coating and developing apparatus (Clean Track manufactured by Tokyo Electron Limited, trade name "MARK-Vz"), the composition (S-146-1) was coated according to the spin coat method, followed by baking at 250° C. for 2 minutes, and the organic film 146 having a film thickness of 0.6 μm was formed.

After coating the infrared-absorbing composition (S-142-1) on the organic film 146 using the spin coat method, followed by prebaking for 2 minutes on a hot plate at 100° C., and a coated film having a film thickness of 1.0 μm was formed. After that, by postbaking on the hot plate at 200° C. for 5 minutes, two silicon wafers having the infrared cut filter layer 142 were prepared.

For one silicon wafer, the adhesiveness of the infrared cut filter layer 142 formed on the organic film 146 was measured according to a grid cellophane tape peel test of JIS K5400, and evaluated based on the film residual rate in 100 grids of 1 mm square according to the following criteria.

Circle: the film residual rate was 100 to 90%
Delta: the film residual rate was less than 90 to 50% and
Times: the film residual rate was less than 50 to 0%.

As a result, the adhesiveness was circle. Therefore, it was determined that the adhesiveness between the organic film 146 and the infrared cut filter layer 142 was excellent.

Next, on another silicon wafer, the thermosetting resin composition (S-144-1) was coated such that a dry film thickness of the coated film is 0.5 μm, followed by heating using the hot plate at 180° C. for 30 minutes. Thus, the first cured film 144a was formed.

The adhesiveness of the first cured film 144a formed on the infrared cut filter layer 142 was measured according to a grid cellophane tape peel test of JIS K5400, and evaluated based on the film residual rate in 100 grids of 1 mm square according to the same criteria as described above.

As a result, the adhesiveness was circle. Therefore, it was determined that the adhesiveness between the infrared cut filter layer 142 and the cured film 144a was excellent.

Example 2

In the same manner as Example 1 except that an infrared-absorbing composition (S-142-2) including 100 parts by mass of YMF-02A (manufactured by SUMITOMO METAL MINING CO., LTD.) as the infrared-absorbing agent, 19.08 parts by mass of a copolymer of benzyl methacrylate/styrene/N-phenylmaleimide/2-hydroxyethyl methacrylate/2-ethylhexyl methacrylate/methacrylic acid=14/10/12/15/29/20 (mass ratio) (acid value: 130 mg KOH/g, 33.9% by mass solution of propylene glycol monoethyl ether acetate) that is an acrylic resin as the binder resin, 1.48 parts by mass of trimethylol propane polyglycidyl ether as the polymerizable compound, 0.02 parts by mass of Futajiento FTX-218 (manufactured by NEOS COMPANY LIMITED) that is a fluorinated surfactant as the additive, and 61.77 parts by mass of propylene glycol monomethyl ether acetate as the solvent was used, the organic film 146, the infrared cut filter layer 142, and the first cured film 144a were formed and evaluated. As the result thereof, the adhesiveness of the infrared cut filter layer 142 formed on the organic film 146 was circle, and the adhesiveness of the first cured film 144a formed on the infrared cut filter layer 142 was circle.

Example 3

By dissolving 10.00 g of maleic anhydride in 90.00 g of propylene glycol monomethyl ether by heating, a 10% maleic anhydride solution was prepared. Subsequently, 1.80 g of the prepared 10% maleic anhydride solution and 43.95 g of water were mixed to prepare an acid catalyst solution.

Subsequently, 33.26 g of methyltrimethoxysilane, 112.98 g of phenyltrimethoxysilane, and 108.00 g of propylene glycol monomethyl ether were added in a flask, and a dropping funnel in which a cooling pipe and the acid catalyst prepared in advance are put was set. Then, after heating the flask at 50° C. by an oil bath, the acid catalyst solution was gradually dropped, after the end of the dropping, followed by reacting at 60° C. for 3 hours. After the end of the reaction, the flask in which a reaction solution is present was left to cool.

Next, the reaction solution was transferred into another flask and concentrated until the solid content becomes 50% by an evaporator, followed by diluting with PGME until the solid content becomes 30%. Next, after concentrating once more until the solid content becomes 50%, by performing an operation of diluting with PGME until the solid content becomes 35% by mass, followed by removing remaining water or methanol, a polysiloxane solution of solid content of 35% by mass (Mw=760, Mn=640, and Mw/Mn=1.6) was obtained.

In the same manner as Example 1 except that an infrared-absorbing composition (S-142-3) including 100 parts by mass of YMF-02A (manufactured by SUMITOMO METAL MINING CO., LTD.) as the infrared-absorbing agent, 22.73 parts by mass of the above-synthesized polysiloxane solution as the binder resin, 0.27 parts by mass of 1-(4,7-dibitoxy-1-naphtharenyl) tetrahydrothiophenium trifluoromethanesulfonate as the catalyst, 0.02 parts by mass of Futajiento FTX-218 (manufactured by NEOS COMPANY LIMITED) that is a fluorinated surfactant as the additive, and 60.67 parts by mass of propylene glycol monomethyl ether acetate as the solvent was used, the organic film 146, the infrared cut filter layer 142, and the first cured film 144a were formed and evaluated. As the result thereof, the adhesiveness of the infrared cut filter layer 142 formed on the organic film 146 was circle, and the adhesiveness of the first cured film 144a formed on the infrared cut filter layer 142 was circle.

What is claimed is:

1. A solid-state imaging device comprising:
a first pixel including a color filter layer over a light-receiving surface of a first light-receiving element, the color filter layer having a transmission band in a visible light wavelength region;
a second pixel including an infrared pass filter layer over a light-receiving surface of a second light-receiving element, the infrared pass filter layer having a transmission band in an infrared wavelength region;
an infrared cut filter layer overlapping with the color filter layer to transmit light in the visible light wavelength region and block light in the infrared wavelength region;
a cured film between the color filter layer and the infrared cut filter layer; and
a second cured film over the infrared cut filter, wherein
a top surface of the infrared pass filter layer has a height substantially coinciding with a height of a top surface of the color filter layer, and
the second cured film is in contact with the cured film in the second pixel.

2. The solid-state imaging device according to claim 1, wherein
the infrared cut filter layer is over a top surface side of the color filter layer, and
the cured film is in contact with a lower surface of the infrared cut filter layer.

3. The solid-state imaging device according to claim 2, wherein the second cured film is in contact with a top surface of the infrared cut filter layer.

4. The solid-state imaging device according to claim 3, wherein the second cured film is in contact with a side surface of the infrared cut filter layer.

5. The solid-state imaging device according to claim 1, wherein the infrared cut filter layer contains an infrared-absorbing agent having a maximum absorption wavelength in a range of wavelength of from 600 to 2000 nm and has a film thickness of from 0.1 to 15 μm.

6. The solid-state imaging device according to claim 5, wherein the infrared-absorbing agent is at least one kind of compound selected from the group consisting of a diiminium-based compound, a squarylium-based compound, a cyanine-based compound, a phthalocyanine-based compound, a naphthalocyanine-based compound, a quaterrylene-based compound, an aminium-based compound, an iminium-based compound, an azo-based compound, an anthraquinone-based compound, a porphyrine-based compound, a pyrrolopyrrole-based compound, an oxonol-based compound, a croconium-based compound, a hexaphyrin-based compound, a metal dithiol-based compound, a copper compound, a tungsten compound and a metal boride.

7. The solid-state imaging device according to claim 1, wherein the infrared cut filter layer is formed using an infrared-absorbing composition containing at least one kind selected from an infrared-absorbing agent, a binder resin and a polymerizable compound.

8. The solid-state imaging device according to claim 1, wherein a top surface of the infrared cut filter layer and the infrared pass filter layer are further provided with an optical filter layer having an average transmittance of 75% or higher in a range of wavelength of from 430 to 580 nm, an average transmittance of 15% or lower in a range of wavelength of from 720 to 750 nm, an average transmittance of 60% or higher in a range of wavelength of from 810 to 820 nm, and an average transmittance of 15% or lower in a range of wavelength of from 900 to 2000 nm.

9. The solid-state imaging device according to claim 1, wherein an organic film is provided on a lower surface of the color filter layer.

10. The solid-state imaging device according to claim 1, wherein an organic film is provided on a lower surface of the infrared cut filter layer.

11. A solid state imaging device comprising:
a first pixel including a color filter layer over a first light-receiving element;
a second pixel including an infrared pass filter layer over a second light-receiving element;
a first cured film over the color filter layer and the infrared pass filter layer;
an infrared cut filter layer over the first cured film in the first pixel; and
a second cure film over the infrared cut filer layer,
wherein the second cured film is in contact with the first cured film in the second pixel.

12. The solid-state imaging device according to claim 11, wherein the infrared cut filter layer is in contact with the first cured film and the second cured film.

13. The solid-state imaging device according to claim 11, wherein a top surface of the color filter layer has a height substantially coinciding with a height of a top surface of the infrared pass filter.

* * * * *